US012801018B2

(12) United States Patent
Wakayama et al.

(10) Patent No.: US 12,801,018 B2
(45) Date of Patent: Nov. 17, 2026

(54) RESIST UNDERLAYER FILM-FORMING COMPOSITION CONTAINING PROTECTED BASIC ORGANIC GROUP

(71) Applicant: NISSAN CHEMICAL CORPORATION, Tokyo (JP)

(72) Inventors: Hiroyuki Wakayama, Toyama (JP); Shou Shimizu, Toyama (JP); Kosuke Igata, Toyama (JP); Mamoru Tamura, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 573 days.

(21) Appl. No.: 18/282,103

(22) PCT Filed: Mar. 18, 2022

(86) PCT No.: PCT/JP2022/012508
§ 371 (c)(1),
(2) Date: Sep. 14, 2023

(87) PCT Pub. No.: WO2022/202644
PCT Pub. Date: Sep. 29, 2022

(65) Prior Publication Data

US 2024/0184204 A1 Jun. 6, 2024

(30) Foreign Application Priority Data

Mar. 22, 2021 (JP) ................................ 2021-047038

(51) Int. Cl.
*G03F 7/039* (2006.01)
*G03F 7/004* (2006.01)
*G03F 7/16* (2006.01)

(52) U.S. Cl.
CPC .......... *G03F 7/0395* (2013.01); *G03F 7/0048* (2013.01); *G03F 7/168* (2013.01)

(58) Field of Classification Search
CPC ............ G03F 7/11; C08G 73/06; C08G 65/34
See application file for complete search history.

(56) References Cited

U.S. PATENT DOCUMENTS 7,214,743 B2 * 5/2007 Hatakeyama ........... G03F 7/038 525/534
12,189,294 B2 * 1/2025 Kamibayashi ............ G03F 7/11
2012/0183903 A1 7/2012 Hatakeyama et al.
2012/0251950 A1 10/2012 Horiguchi et al.
2014/0170567 A1 6/2014 Sakamoto et al.
2014/0287589 A1 9/2014 Endo et al.
2015/0031206 A1 1/2015 Endo et al.
2015/0087155 A1 3/2015 Endo et al.
2015/0362838 A1 * 12/2015 Endo ....................... G03F 7/091 524/600
2017/0250079 A1 8/2017 Nishita et al.
2019/0086806 A1 * 3/2019 Usui ......................... G03F 7/11
2019/0317405 A1 10/2019 Nishita et al.

FOREIGN PATENT DOCUMENTS

JP 2013-064971 A 4/2013
KR 2014-0141600 A 12/2014
KR 2015-0013679 A 2/2015
KR 2017-0070017 A 6/2017
WO 2011/074433 A1 6/2011
WO 2013/018802 A1 2/2013
WO 2013/058189 A1 4/2013
WO 2013/168610 A1 11/2013
WO 2016/063805 A1 4/2016
WO 2017/086213 A1 5/2017

OTHER PUBLICATIONS

Sep. 8, 2025 Office Action issued in Korean Patent Application No. 10-2023-7029123.
May 31, 2022 International Search Report issued in International Patent Application No. PCT/JP2022/012508.
Sep. 12, 2023 International Preliminary Report on Patentability issued in International Patent Application No. PCT/JP2022/012508.

* cited by examiner

*Primary Examiner* — Amanda C. Walke
(74) *Attorney, Agent, or Firm* — Oliff PLC

(57) ABSTRACT

A composition for forming a resist underlayer film that enables the formation of a resist pattern; and resist pattern production and semiconductor device manufacturing methods, which use the composition for forming a resist underlayer film. The composition for forming a resist underlayer film has a basic organic group substituted with a protecting group in the repeating unit structure of a polymer containing a heterocycle, or at a terminal thereof, and further includes a solvent. The polymer may include a heterocycle containing an alkenyl group having 2-10 carbon atoms. The polymer may have, in a main chain thereof, at least one structural unit represented by Formula (3). (In Formula (3), A1, A2, A3, A4, A5, and A6 each independently represent a hydrogen atom, a methyl group, or an ethyl group, and Q1 represents a divalent organic group including a heterocycle, and m1 and m2 each independently represent 0 or 1.)

15 Claims, No Drawings

RESIST UNDERLAYER FILM-FORMING COMPOSITION CONTAINING PROTECTED BASIC ORGANIC GROUP

TECHNICAL FIELD

The present invention relates to a composition for use in a lithography process in manufacturing a semiconductor, in particular, in the state-of-the-art (ArF, EUV, EB, or the like) lithography process. In addition, the present invention relates to a method for manufacturing a substrate with a resist pattern to which the resist underlayer film is applied and a method for manufacturing a semiconductor device.

BACKGROUND ART

Conventionally, in manufacturing of a semiconductor device, fine processing by lithography using a resist composition has been performed. The fine processing is a processing method for forming a thin film of a photoresist composition on a semiconductor substrate such as a silicon wafer, irradiating the thin film with active rays such as ultraviolet rays through a mask pattern in which a pattern of a device is formed, developing the thin film, and etching the substrate using the obtained photoresist pattern as a protective film, thereby forming fine unevenness corresponding to the pattern on a surface of the substrate. In recent years, a degree of integration of a semiconductor device has been increased, and in addition to an i-line (wavelength: 365 nm), a KrF excimer laser (wavelength: 248 nm), and an ArF excimer laser (wavelength: 193 nm) that have been used in the related art, active rays used for practical application of an extreme ultraviolet ray (EUV) (wavelength: 13.5 nm) or an electron beam (EB) have been studied for the state-of-the-art fine processing. Accordingly, there is a serious problem of resist pattern formation defects due to the influence of the semiconductor substrate and the like. Therefore, in order to solve this problem, a method of providing a resist underlayer film between the resist and the semiconductor substrate has been widely studied. Patent Literature 1 discloses an additive for a resist underlayer film-forming composition and a resist underlayer film-forming composition containing the same. Patent Literature 2 discloses a resist underlayer film-forming composition for EUV lithography containing a condensation polymer.

CITATION LIST

Patent Literature

Patent Literature 1: WO 2013/058189 A
Patent Literature 2: WO 2013/018802 A

SUMMARY OF INVENTION

Technical Problem

The characteristics required for the resist underlayer film include, for example, that the film does not cause any intermixing with a resist film formed on an upper layer (that is, the film is insoluble in a resist solvent), and that the film has a higher dry etching rate than that of the resist film.

In the case of lithography with EUV exposure, the line width of the resist pattern to be formed is 32 nm or less, and the resist underlayer film for EUV exposure is formed to be thinner than before. When such a thin film is formed, pinholes, agglomeration, and the like are likely to occur due to the influence of the surface of the substrate, the polymer to be used, and the like, and it was difficult to form a uniform film without defects.

On the other hand, when a resist pattern is formed, in a development process such as a negative development process in which an unexposed portion of a resist film is removed using a solvent that can dissolve the resist film, usually an organic solvent, and an exposed portion of the resist film is left as a resist pattern or a positive development process in which an exposed portion of the resist film is removed and an unexposed portion of the resist film is left as a resist pattern, improvement of adhesion of the resist pattern is a major problem.

In addition, it is required to suppress deterioration of line width roughness ((LWR), fluctuation in line width (roughness)) at the time of forming a resist pattern, to form a resist pattern having a preferred rectangular shape, and to improve resist sensitivity. In addition, it is also required to improve a limiting resolution (minimum size at which the resist pattern is not collapsed).

An object of the present invention is to provide a composition for forming a resist underlayer film and a resist pattern forming method using the resist underlayer film-forming composition which have solved the above problems and can form a desired resist pattern.

Solution to Problem

The present invention encompasses the followings.

[1] A resist underlayer film-forming composition containing a polymer and a solvent, wherien the polymer has a repeating unit structure containing a heterocyclic ring, and at least a part of the repeating unit structure contains a basic organic group substituted with a protecting group.

[2] A resist underlayer film-forming composition containing a polymer and a solvent, wherein the polymer has a repeating unit structure containing a heterocyclic ring, and the polymer contains a basic organic group substituted with a protecting group at a terminal.

[3] The resist underlayer film-forming composition according to [1] or [2], wherein the polymer contains a heterocyclic ring containing an alkenyl group having 2 to 10 carbon atoms.

[4] The resist underlayer film-forming composition according to any one of [1] to [3], wherein the polymer contains two or more of the heterocyclic rings.

[5] The resist underlayer film-forming composition according to any one of [1] to [4], in which the polymer has at least one structural unit represented by the following Formula (3) in a main chain.

[Chem. 1]

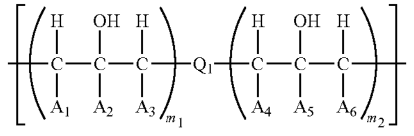

(3)

wherein in Formula (3), $A_1$, $A_2$, $A_3$, $A_4$, $A_5$, and $A_6$ each independently represent a hydrogen atom, a methyl group, or an ethyl group; $Q_1$ represents a divalent organic group containing a heterocyclic ring; and $m_1$ and $m_2$ each independently represent 0 or 1.

[6] The resist underlayer film-forming composition according to [5], wherein in Formula (3), $Q_1$ represents a divalent organic group represented by the following Formula (5).

[Chem. 2]

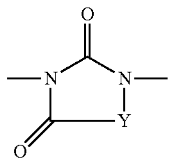

(5)

wherein in Formula (5), Y represents a divalent group represented by the following Formula (6) or (7).

[Chem. 3]

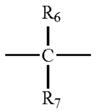

(6)

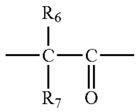

(7)

wherein in Formulas (6) and (7), $R_6$ and $R_7$ each independently represent a hydrogen atom, an alkyl group having 1 to 10 carbon atoms, an alkenyl group having 2 to 10 carbon atoms, a benzyl group, or a phenyl group, and the phenyl group may be substituted with at least one member selected from the group consisting of an alkyl group having 1 to 10 carbon atoms, a halogen atom, an alkoxy group having 1 to 10 carbon atoms, a nitro group, a cyano group, and an alkylthio group having 1 to 6 carbon atoms, or $R_6$ and $R_7$ may be bonded to each other to form a ring having 3 to 6 carbon atoms together with a carbon atom bonded to $R_6$ and $R_7$.

[7] The resist underlayer film-forming composition according to [5], wherein in Formula (3), $Q_1$ is a divalent organic group having an aromatic ring structure having 6 to 40 carbon atoms which may contain a hydroxy group.

[8] The resist underlayer film-forming composition according to any one of [1] to [7], in which the polymer further contains a disulfide bond in a main chain.

[9] The resist underlayer film-forming composition according to any one of [1] to [8], in which the basic organic group substituted with a protecting group is an acyloxy group having an amino group substituted with a protecting group or an acyloxy group having a nitrogen-containing heterocyclic ring substituted with a protecting group.

[10] The resist underlayer film-forming composition according to [9], wherien the protecting group is selected from the group consisting of a tert-butoxycarbonyl group, a benzyloxycarbonyl group, a 9-fluorenylmethyloxycarbonyl group, a 2,2,2-trichloroethoxycarbonyl group, and an allyloxycarbonyl group.

[11] The resist underlayer film-forming composition according to any one of [1] to [10], further containing an acid generator.

[12] The resist underlayer film-forming composition according to any one of [1] to [11], further containing a crosslinking agent.

[13] A resist underlayer film that is a baked product of a coating film formed of the resist underlayer film-forming composition according to any one of [1] to [12].

[14] A method for manufacturing a patterned substrate, the method comprising:

applying the resist underlayer film-forming composition according to any one of [1] to [12] onto a semiconductor substrate and baking the resist underlayer film-forming composition to form a resist underlayer film;

applying a resist onto the resist underlayer film and baking the resist to form a resist film;

exposing the resist underlayer film and the semiconductor substrate coated with the resist; and developing the resist film after the exposure and performing patterning.

[15] A method for manufacturing a semiconductor device, the method comprising:

forming a resist underlayer film from the resist underlayer film-forming composition according to any one of [1] to [12] on a semiconductor substrate;

forming a resist film on the resist underlayer film;

forming a resist pattern by irradiating the resist film with a light or electron beam followed by development;

forming a patterned resist underlayer film by etching the resist underlayer film through the formed resist pattern; and processing the semiconductor substrate by the patterned resist underlayer film.

Advantageous Effects of Invention

Because the resist underlayer film-forming composition of the present invention has excellent coatability to a semiconductor substrate to be processed and has excellent adhesion at an interface between a resist and a resist underlayer film at the time of resist pattern formation, it is possible to suppress deterioration of line width roughness ((LWR), fluctuation in line width (roughness)) at the time of resist pattern formation without peeling of the resist pattern, such that a resist pattern size (minimum CD size) can be minimized, a limiting resolution can be improved, and the resist pattern can be formed into an excellent rectangular resist pattern. In particular, a remarkably advantageous effect is exhibited when EUV (wavelength: 13.5 nm) or EB (electron beam) is used.

DESCRIPTION OF EMBODIMENTS

<Resist Underlayer Film-Forming Composition>

A resist underlayer film-forming composition of the present invention contains a basic organic group substituted with a protecting group in a repeating unit structure of a polymer containing a heterocyclic ring, and further contains a solvent. The resist underlayer film-forming composition of the present invention contains a polymer and a solvent, in which the polymer has a repeating unit structure containing a heterocyclic ring, and at least a part of the repeating unit structure contains a basic organic group substituted with a protecting group.

The polymer containing a heterocyclic ring referred to in the present invention is a polymer having a heterocyclic structure in the repeating unit structure of the polymer. All of the repeating unit structures in the polymer may contain a basic organic group substituted with a protecting group, and a part of the repeating unit structure in the polymer may contain a basic organic group substituted with a protecting group. In this case, a molar ratio of the "repeating unit structure containing a basic organic group substituted with a protecting group" to the "repeating unit structure containing no basic organic group substituted with a protecting group" is not particularly limited, and is, for example, in a range of 1:9 to 9:1, 2:8 to 8:2, 3:7 to 7:3, or 4:6 to 6:4.

The resist underlayer film-forming composition of the present invention may contain a basic organic group substituted with a protecting group at a polymer terminal containing a heterocyclic ring. The resist underlayer film-forming composition of the present invention contains a polymer and a solvent, in which the polymer has a repeating unit structure containing a heterocyclic ring, and the polymer contains a basic organic group substituted with a protecting group at a terminal. For example, when the polymer is linear, the polymer may contain a basic organic group substituted with a protecting group at both terminals, or may contain a basic organic group at only one terminal. The same applies when the polymer is branched. A repeating unit structure present at a site other than the terminal of the polymer may or may not contain the basic organic group substituted with a protecting group.

<Basic Organic Group Substituted with Protecting Group>

The basic organic group in the present invention refers to a monovalent saturated or unsaturated group containing a carbon atom, a hydrogen atom, and a heteroatom (for example, at least one atom selected from the group consisting of an oxygen atom, a sulfur atom, and a nitrogen atom) and exhibiting basicity due to uneven distribution of electrons in a molecular structure caused by the heteroatom. Preferably, the heteroatom is at least two atoms selected from the group consisting of an oxygen atom, a sulfur atom, and a nitrogen atom, or is at least one atom selected from the group consisting of an oxygen atom and a nitrogen atom, and more preferably, the heteroatom is an oxygen atom or a nitrogen atom. The organic group is preferably an acyloxy group having an amino group substituted with a protecting group or an acyloxy group having a nitrogen-containing heterocyclic ring substituted with a protecting group.

The term "protecting group" as used herein refers to a group functioning in such a manner that it is bonded to the amino group or nitrogen-containing heterocyclic ring to prevent the change during a predetermined chemical reaction, but is then eliminated by a predetermined means to recover the original amino group or nitrogen-containing heterocyclic ring. Examples of a preferred protecting group include a carbamate-based protecting group such as a t-butoxycarbonyl group, a benzyloxycarbonyl group, a 9-fluorenylmethyloxycarbonyl group, a 2,2,2-trichloroethoxycarbonyl group, and an allyloxycarbonyl group; a sulfonamide-based protecting group such as a tosyl group and a nosyl group; an imide-based protecting group such as a phthaloyl group, and a trifluoroacetyl group. For example, in a case where the protecting group is a tert-butoxycarbonyl group, an acyloxy group having an amino group protected by a tert-butoxycarbonyl group or an acyloxy group having a nitrogen-containing heterocyclic ring protected by a tert-butoxycarbonyl group is represented by, for example, the following Formulas (a) to (m). Here, the acyloxy group is represented by "—OC(=O)—R" (R represents an organic group having an amino group protected by a tert-butoxycarbonyl group or an organic group having a nitrogen-containing heterocyclic ring protected by a tert-butoxycarbonyl group), and the tert-butoxycarbonyl group may be abbreviated as "t-Boc" or "Boc".

[Chem. 4]

(a)

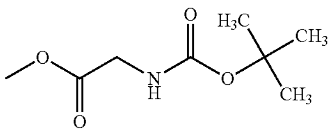

(b)

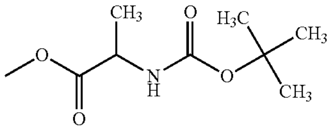

(c)

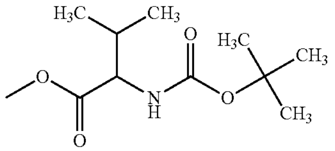

(d)

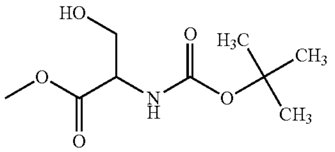

(e)

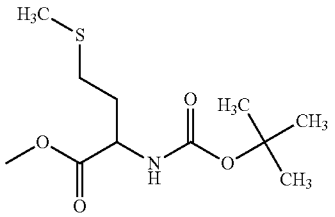

(f)

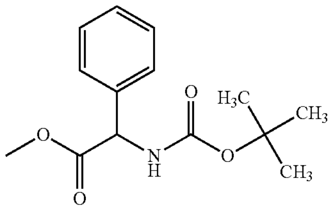

(g)

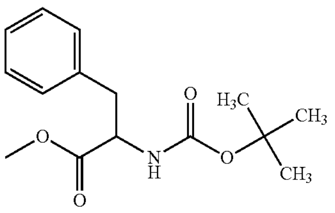

(h)

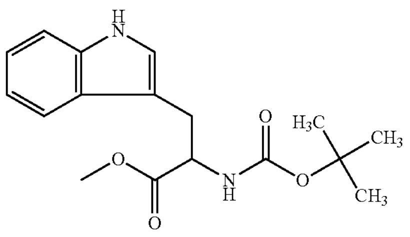

-continued (i)

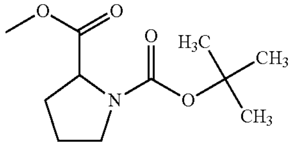

(j)

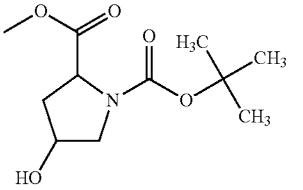

(k)

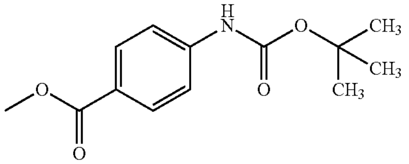

(l)

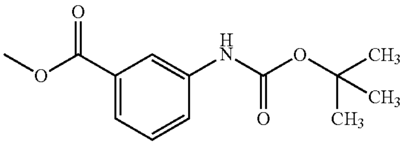

(m)

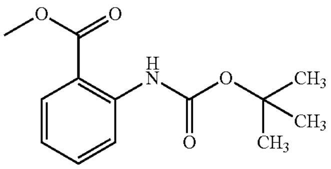

The protecting group is preferably selected from a tert-butoxycarbonyl group, a benzyloxycarbonyl group, a 9-fluorenylmethyloxycarbonyl group, a 2,2,2-trichloroethoxycarbonyl group, and an allyloxycarbonyl group; and of these, a tert-butoxycarbonyl group is preferable.

Examples of the heterocyclic ring include furan, thiophene, pyrrole, imidazole, pyran, pyridine, pyrimidine, pyrazine, pyrrolidine, piperidine, piperazine, morpholine, indole, purine, quinoline, isoquinoline, quinuclidine, chromene, thianthrene, phenothiazine, phenoxazine, xanthene, acridine, phenazine, carbazole, triazinone, triazinedione, and triazinetrione.

In addition, the heterocyclic ring may have a structure derived from barbituric acid.

The polymer may contain a heterocyclic ring containing an alkenyl group having 2 to 10 carbon atoms.

Examples of the alkenyl group having 2 to 10 carbon atoms include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-ethylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-l-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-l-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group. Of these, a 1-propenyl group is preferable.

The polymer may contain two or more of the heterocyclic rings.

The polymer may have in the main chain at least one structural unit represented by the following Formula (3) described in WO 2020/226141 A.

[Chem. 5]

(3)

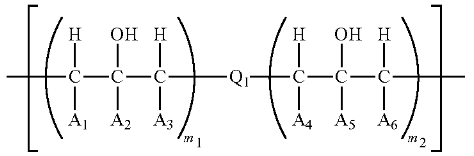

wherein in Formula (3), $A_1$, $A_2$, $A_3$, $A_4$, $A_5$, and $A_6$ each independently represent a hydrogen atom, a methyl group, or an ethyl group; $Q_1$ represents a divalent organic group containing a heterocyclic ring; and $m_1$ and $m_2$ each independently represent 0 or 1.

The heterocyclic ring is as described above.

In Formula (3), $Q_1$ represents a divalent organic group represented by the following Formula (5).

[Chem. 6]

(5)

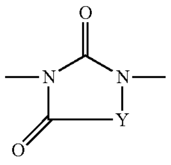

wherein in Formula (5), Y represents a divalent group represented by the following Formula (6) or Formula (7).

[Chem. 7]

(6)

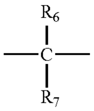

(7)

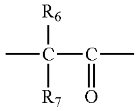

wherein in Formulas (6) and (7), $R_6$ and $R_7$ each independently represent a hydrogen atom, an alkyl group having 1 to 10 carbon atoms, an alkenyl group having 2 to 10 carbon atoms, a benzyl group, or a phenyl group, and the phenyl group may be substituted with at least one member selected from the group consisting of an alkyl group having 1 to 10 carbon atoms, a halogen atom, an alkoxy group having 1 to 10 carbon atoms, a nitro group, a cyano group, and an alkylthio group having 1 to 6 carbon atoms, or $R_6$and $R_7$ may be bonded to each other to form a ring having 3 to 6 carbon atoms together with a carbon atom bonded to $R_6$and $R_7$.

Examples of the alkyl group having 1 to 10 carbon atoms include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-l-methyl-cyclopropyl group, a 2-ethyl-2-methyl-cyclopropyl group, a 2-ethyl-3-methyl-cyclopropyl group, a decyl group, an undecyl group, a dodecyl group, a tridecyl group, a tetradecyl group, a pentadecyl group, a hexadecyl group, a heptadecyl group, an octadecyl group, a nonadecyl group, and an icodecyl group.

Examples of the alkoxy group having 1 to 10 carbon atoms include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group, an n-heptyloxy group, an n-octyloxy group, an n-nonyloxy group, and an n-decanyloxy group.

Examples of the alkylthio group having 1 to 6 carbon atoms include a methylthio group, an ethylthio group, a propylthio group, a butylthio group, a pentylthio group, and a hexylthio group.

Examples of the halogen atom include a fluorine atom, a chlorine atom, a bromine atom, and an iodine atom.

Examples of the ring having 3 to 6 carbon atoms include cyclopropane, cyclobutane, cyclopentane, cyclopentadiene, and cyclohexane.

The entire disclosure of WO 2020/226141 A is incorporated in the present application by reference.

In Formula (3), $Q_1$ may be a divalent organic group having an aromatic ring structure having 6 to 40 carbon atoms which may contain a hydroxy group.

The aromatic ring structure having 6 to 40 carbon atoms is an aromatic ring structure derived from benzene, naphthalene, anthracene, acenaphthene, fluorene, triphenylene, phenalene, phenanthrene, indene, indane, indacene, pyrene, chrysene, perylene, naphthacene, pentacene, coronene, heptacene, benzo[a]anthracene, dibenzophenanthrene, dibenzo[a,j]anthracene, or the like.

The polymer may further contain a disulfide bond in the main chain.

The polymer may have a weight average molecular weight, for example, within the range of 2,000 to 50,000.

Examples of the monomer that forms a structural unit represented by Formula (3) in which $m_1$ and $m_2$ represent 1 include, but are not limited to, compounds containing two epoxy groups represented by the following Formulas (10-a) to (10-k),

[Chem. 8]

(10-a)

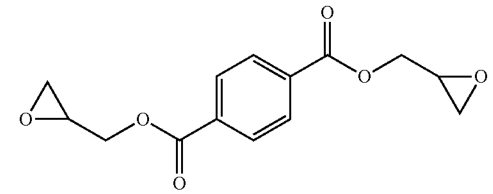

(10-b)

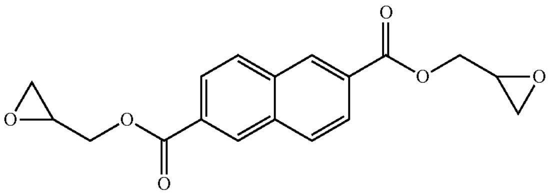

(10-c)

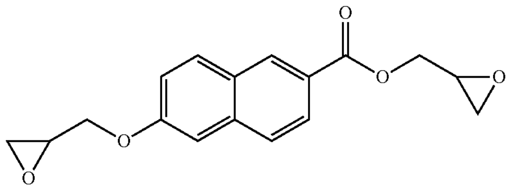

(10-d)

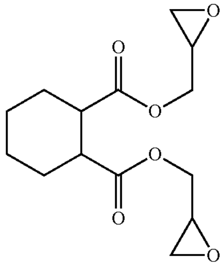

(10-e)

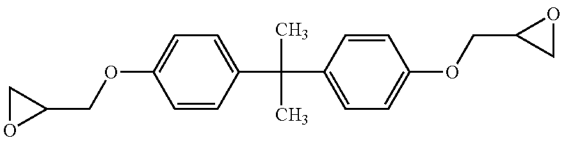

(10-f)

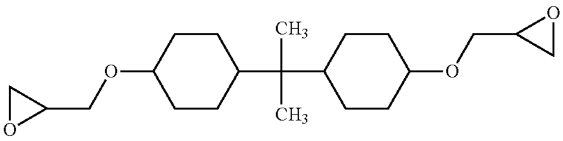

(10-g)

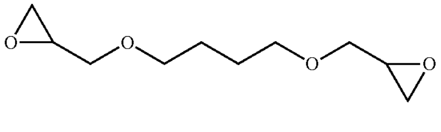

-continued (10-h)

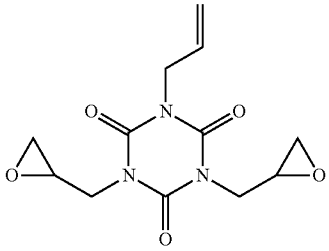

(10-i)

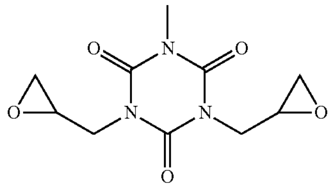

(10-j)

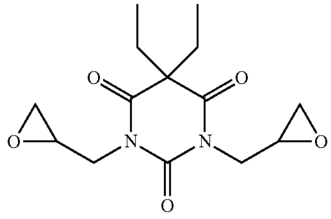

(10-k)

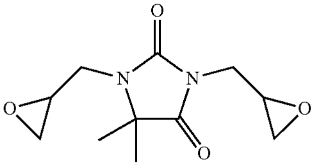

that is, diglycidyl 1,4-terephthalate, diglycidyl 2,6-naphthalenedicarboxylate, diglycidyl 1,6-dihydroxynaphthalenedicarboxylate, diglycidyl 1,2-cyclohexanedicarboxylate, 2,2-bis(4-hydroxyphenyl)propane diglycidyl, 2,2-bis(4-hydroxycyclohexane)propane diglycidyl, 1,4-butanediol diglycidyl, diglycidyl monoallyl isocyanurate, diglycidyl monomethyl isocyanurate, diglycidyl 5,5-diethylbarbiturate, and 5,5-dimethylhydantoin diglycidyl.

Examples of the monomer that forms a structural unit represented by Formula (3) in which $m_1$ and $m_2$ are represented by 0 include, but are not limited to, compounds containing two carboxyl groups, hydroxyphenyl groups, or imide groups represented by the following Formulas (11-a) to (11-s), and an acid dianhydride,

[Chem. 9]

(11-a)

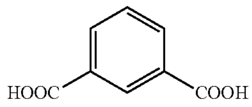

(11-b)

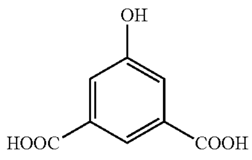

-continued (11-c)

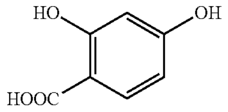

(11-d)

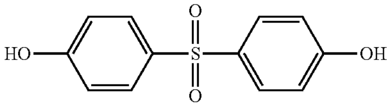

(11-e)

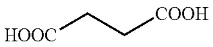

(11-f)

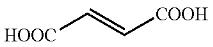

(11-g)

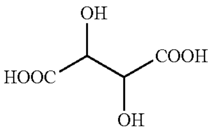

(11-h)

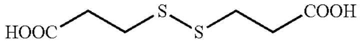

(11-i)

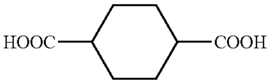

(11-j)

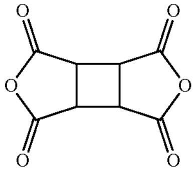

(11-k)

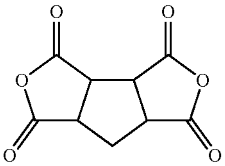

(11-l)

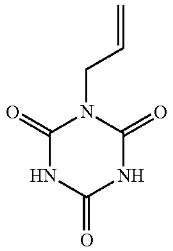

(11-m)

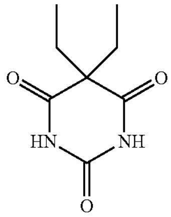

(11-n)

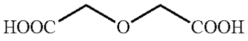

-continued (11-o)

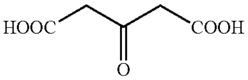

(11-p)

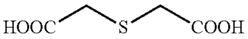

(11-q)

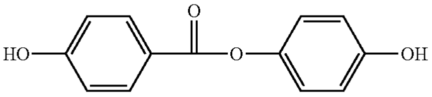

(11-r)

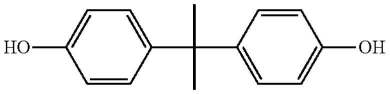

(11-s)

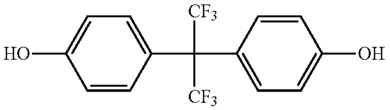

that is, isophthalic acid, 5-hydroxyisophthalic acid, 2,4-dihydroxybenzoic acid, 2,2-bis(4-hydroxyphenyl)sulfone, succinic acid, fumaric acid, tartaric acid, 3,3-dithiodipropionic acid, 1,4-cyclohexanedicarboxylic acid, cyclobutanoic dianhydride, cyclopentanoic dianhydride, monoallyl isocyanuric acid, 5,5-diethylbarbituric acid, diglycolic acid, acetonedicarboxylic acid, 2,2 Ahiodiglycolic acid, 4-hydroxyphenyl 4-hydroxybenzoate, 2,2-bis(4-hydroxyphenyl) propane, 2,2-bis(4-hydroxyphenyl)hexafluoropropane, 1,3-bis(carboxymethyl)-5-methyl isocyanurate, and 1,3-bis (carboxymethyl)-5-allylisocyanurate.

<Solvent>

The solvent to be used in the resist underlayer film-forming composition of the present invention is not particularly limited as long as it is a solvent that can uniformly dissolve a solid-containing component such as the polymer at room temperature, and an organic solvent generally used in a chemical solution for a semiconductor lithography process is preferable. Specific examples thereof include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propropylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two or more thereof.

Of these solvents, propylene glycol monomethyl ether, propylene glycol monomethyl ether acetate, ethyl lactate, butyl lactate, and cyclohexanone are preferable.

In particular, propylene glycol monomethyl ether and propylene glycol monomethyl ether acetate are preferable.

<Acid Generator>

As the acid generator contained as an optional component in the resist underlayer film-forming composition of the present invention, both a thermal acid generator and a photoacid generator may be used, but it is preferable to use a thermal acid generator. Examples of the thermal acid generator include sulfonic acid compounds such as p-toluenesulfonic acid, trifluoromethanesulfonic acid, pyridinium p-toluenesulfonate (pyridinium p-toluenesulfonic acid), pyridinium phenolsulfonic acid, pyridinium p-hydroxybenzenesulfonic acid (p-phenolsulfonic acid pyridinium salt), pyridinium-trifluoromethanesulfonic acid, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid, and carboxylic acid compounds.

Examples of the photoacid generator include an onium salt compound, a sulfonimide compound, and a disulfonyl diazomethane compound.

Examples of the onium salt compound include iodonium salt compounds such as diphenyliodoniumhexafluorophosphate, diphenyliodoniumtrifluoromethanesulfonate, diphenyliodoniumnonafluoro n-butane sulfonate, diphenyliodoniumperfluoro n-octane sulfonate, diphenyliodoniumcamphorsulfonate, bis(4-tert-butylphenyl)iodoniumcamphorsulfonate, and bis(4-tert-butylphenyl)iodoniumtrifluoromethanesulfonate; and sulfonium salt compounds such as triphenylsulfoniumhexafluoroantimonate, triphenylsulfoniumnonafluoro n-butane sulfonate, triphenylsulfoniumcamphorsulfonate, and triphenylsulfoniumtrifluoromethanesulfonate.

Examples of the sulfonimide compound include N-(trifluoromethanesulfonyloxy)succinimide, N-(nonafluoro n-butanesulfonyloxy)succinimide, N-(camphorsulfonyloxy)succinimide, and N-(trifluoromethanesulfonyloxy)naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The acid generators may be used each alone or in combination of two or more thereof.

In a case where an acid generator is used, it may be used in a proportion, for example, within the range of 0.1% by mass to 50% by mass, and preferably, 1% by mass to 30% by mass, with respect to the following crosslinking agent.

<Crosslinking Agent>

Examples of a crosslinking agent contained as an optional component in the resist underlayer film-forming composition of the present invention include hexamethoxymethylmelamine, tetramethoxymethyl benzoguanamine, 1,3,4,6-tetrakis(methoxymethyl)glycoluril (tetramethoxymethyl glycoluril) (POWDERLINK [registered trademark] 1174), 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea.

In addition, the crosslinking agent of the present application may be a nitrogen-containing compound represented by the following Formula (1d) having 2 to 6 substituents bonded to a nitrogen atom in the molecule, which is described in WO 2017/187969 A.

[Chem. 10]

(1d)

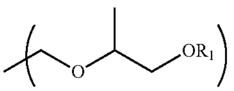

wherein in Formula (1d), $R_1$ represents a methyl group or an ethyl group.

The nitrogen-containing compound having 2 to 6 sub stituents represented by Formula (1d) in the molecule may be a glycoluril derivative represented by the following Formula (1E).

[Chem. 11]

(1E)

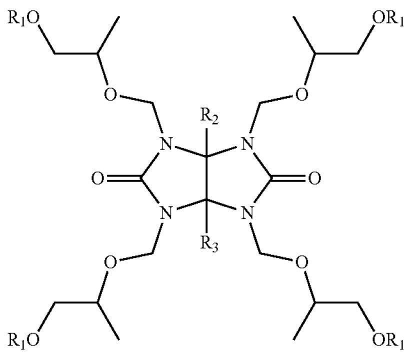

wherein in Formula (1E), four $R_1$'s each independently represent a methyl group or an ethyl group, and $R_2$ and $R_3$ each independently represent a hydrogen atom, an alkyl group having 1 to 4 carbon atoms, or a phenyl group.

Examples of the glycoluril derivative represented by Formula (1E) include compounds represented by the following Formula (1E-1) to Formula (1E-6).

[Chem. 12]

(1E-1)

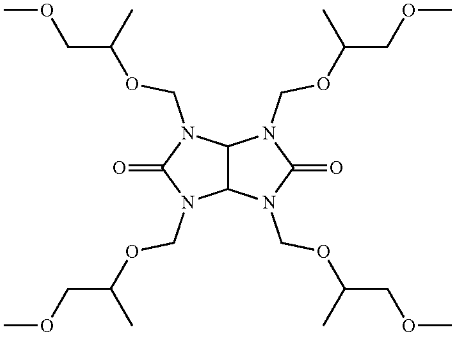

-continued (1E-2)

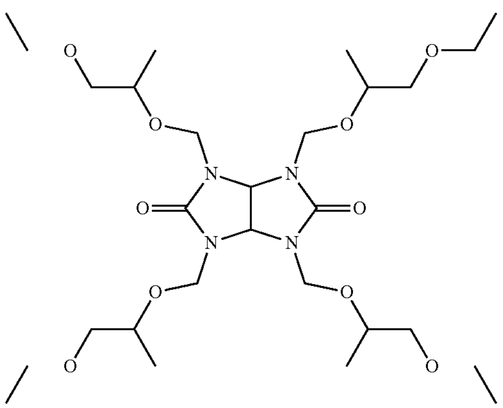

(1E-3)

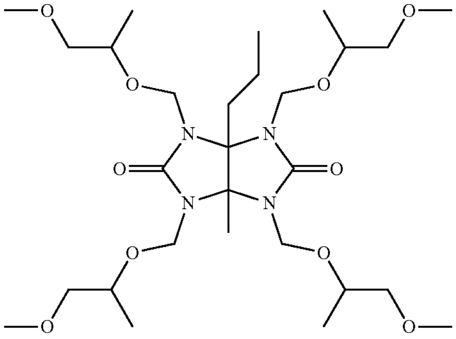

(1E-4)

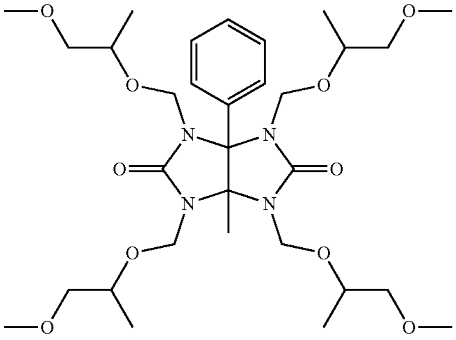

(1E-5)

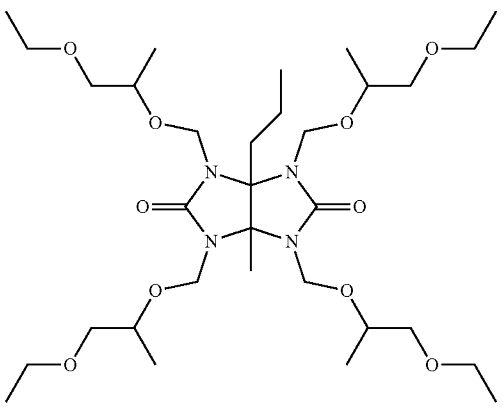

-continued (1E-6)

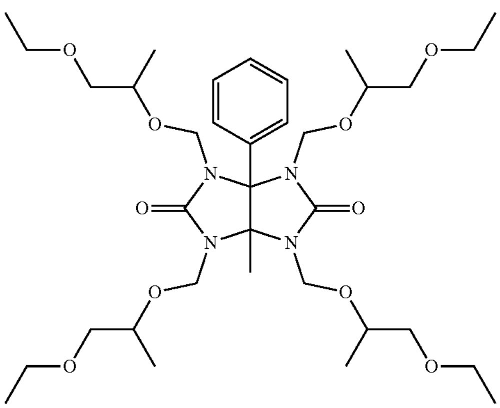

The nitrogen-containing compound having 2 to 6 substituents represented by Formula (1d) in the molecule is obtained by reacting a nitrogen-containing compound having 2 to 6 substituents bonded to a nitrogen atom and represented by the following Formula (2d) in the molecule with at least one compound represented by the following Formula (3d).

[Chem. 13]

(2d)

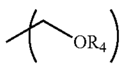

(3d)

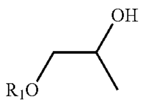

wherein in Formula (2d) and Formula (3d), $R_1$ represents a methyl group or an ethyl group and $R_4$ represents an alkyl group having 1 to 4 carbon atoms.

The glycoluril derivative represented by Formula (1E) is obtained by reacting a glycoluril derivative represented by the following Formula (2E) with at least one compound represented by Formula (3d).

The nitrogen-containing compound having 2 to 6 substituents represented by Formula (2d) in the molecule is, for example, a glycoluril derivative represented by the following Formula (2E).

[Chem. 14]

(2E)

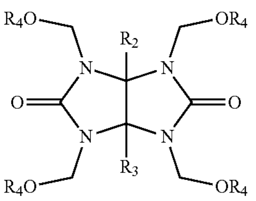

wherein in Formula (2E), $R_2$ and $R_3$ each independently represent a hydrogen atom, an alkyl group having 1 to 4 carbon atoms, or a phenyl group, and $R_4$'s each independently represent an alkyl group having 1 to 4 carbon atoms.

Examples of the glycoluril derivative represented by Formula (2E) include compounds represented by the following Formula (2E-1) to Formula (2E-4). Further, examples of the compound represented by Formula (3d) include compounds represented by the following Formula (3d-1) and Formula (3d-2).

[Chem. 15]

(2E-1)

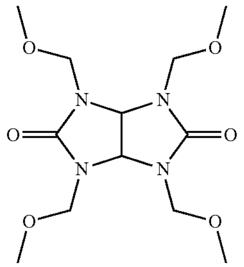

(2E-2)

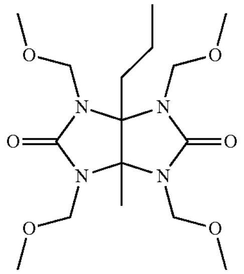

(2E-3)

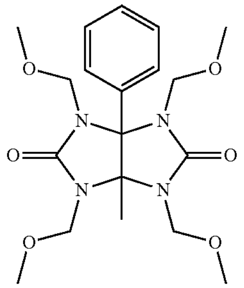

(2E-4)

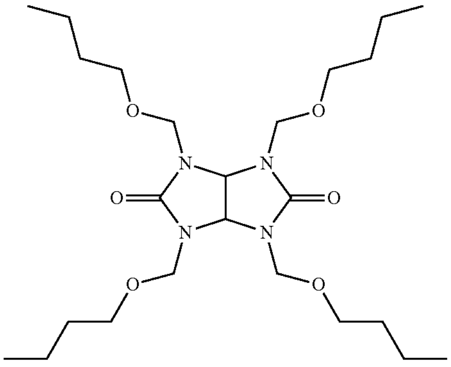

[Chem. 16]

(3d-1)

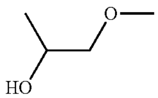

-continued (3d-2)

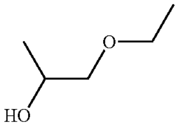

With regard to the details of to the nitrogen-containing compound having 2 to 6 substituents bonded to a nitrogen atom and represented by the following Formula (1d) in the molecule, the entire disclosure of WO 2017/187969 A is incorporated in the present application by reference.

In addition, the crosslinking agent may be a crosslinkable compound represented by the following Formula (G-1) or Formula (G-2) described in WO 2014/208542 A.

[Chem. 17]

Formula (G-1)

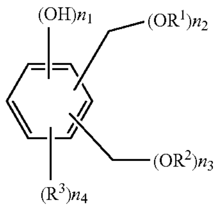

Formula (G-2)

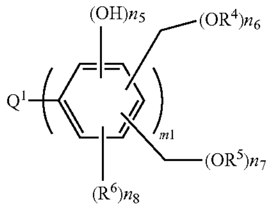

wherein in the formulas, $Q^1$ represents a single bond or an m1-valent organic group, $R^1$ and $R^4$ each represent an alkyl group having 2 to 10 carbon atoms or an alkyl group having 2 to 10 carbon atoms which has an alkoxy group having 1 to 10 carbon atoms, $R^2$ and $R^5$ each represent a hydrogen atom or a methyl group, and $R^3$ and $R^6$ each represent an alkyl group having 1 to 10 carbon atoms or an aryl group having 6 to 40 carbon atoms.

n1 represents an integer satisfying $1 \le n1 \le 3$; n2 represents an integer satisfying $2 \le n2 \le 5$; n3 represents an integer satisfying $0 \le n3 \le 3$; and n4 represents an integer satisfying $0 \le n4 \le 3$ or an integer satisfying $3 \le (n1+n2+n3+n4) \le 6$.

n5 represents an integer satisfying $1 \le n5 \le 3$; n6 represents an integer satisfying $1 \le n6 \le 4$; n7 represents an integer satisfying $0 \le n7 \le 3$; and n8 represents an integer satisfying $0 \le n8 \le 3$ or an integer of $2 \le (n5+n6+n7+n8) \le 5$.

m1 represents an integer of 2 to 10.

The crosslinkable compound represented by Formula (G-1) or Formula (G-2) may be obtained by a reaction of a compound represented by the following Formula (G-3) or Formula (G-4) with a hydroxy group-containing ether compound or an alcohol having 2 to 10 carbon atoms.

[Chem. 18]

Formula (G-3)

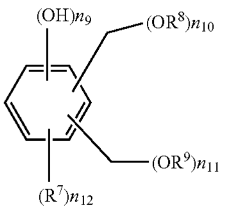

Formula (G-4)

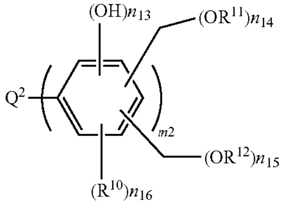

wherein in the formulas, $Q^2$ represents a single bond or an m2-valent organic group, $R^8$, $R^9$, $R^{11}$, and $R^{12}$ each represent a hydrogen atom or a methyl group, and $R^7$ and $R^{10}$ each represent an alkyl group having 1 to 10 carbon atoms or an aryl group having 6 to 40 carbon atoms.

n9 represents an integer satisfying $1 \leq n9 \leq 3$; n10 represents an integer satisfying $2 \leq n10 \leq 5$; n11 represents an integer satisfying $0 \leq n11 \leq 3$; and n12 represents an integer satisfying $0 \leq n12 \leq 3$ or an integer of $3 \leq (n9+n10+n11+n12) \leq 6$.

n13 represents an integer satisfying $1 \leq n13 \leq 3$; n14 represents an integer satisfying $1 \leq n14 \leq 4$; n15 represents an integer satisfying $0 \leq n15 \leq 3$; and n16 represents an integer satisfying $0 \leq n16 \leq 3$ or an integer of $2 \leq (n13+n14+n15+n16) \leq 5$.

m2 represents an integer of 2 to 10.

The compounds represented by Formula (G-1) and Formula (G-2) may be exemplified below.

[Chem. 19]

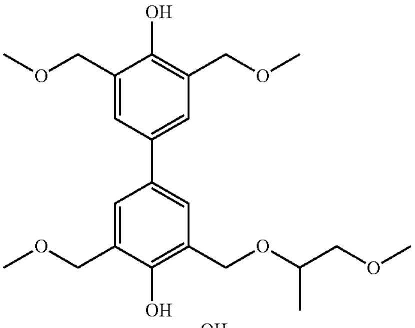

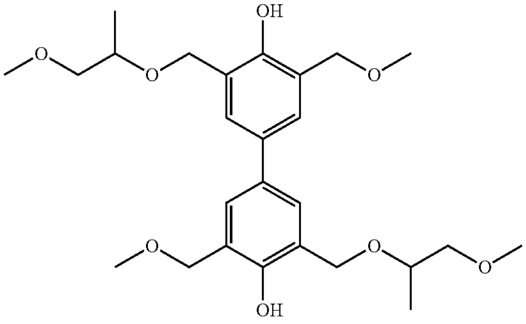

-continued

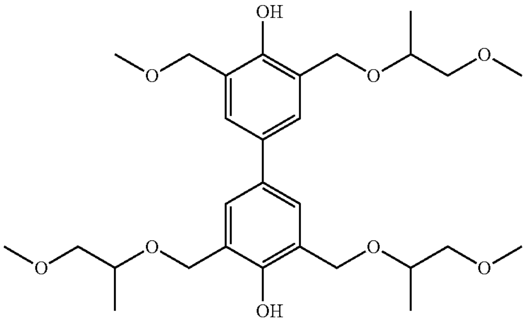

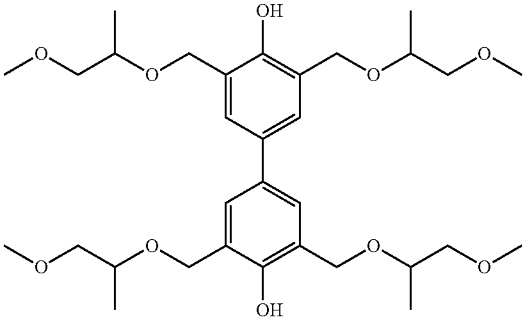

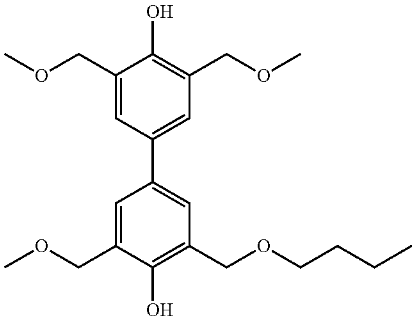

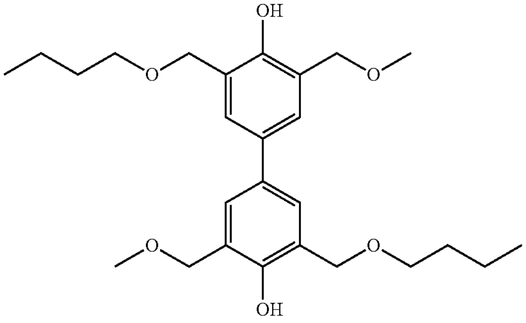

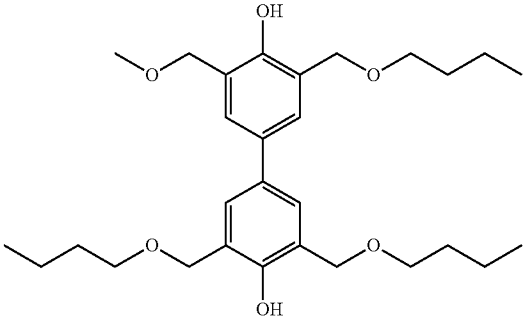

-continued
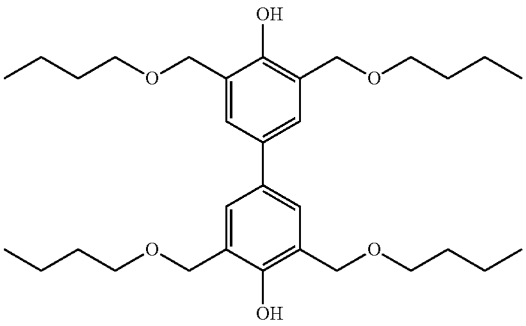
[Chem. 20]
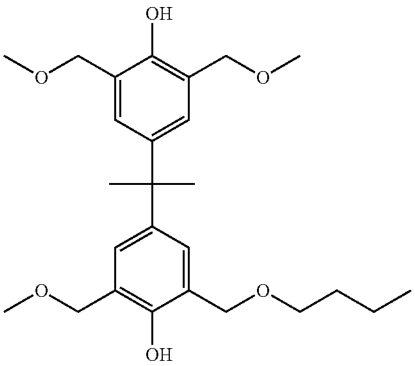
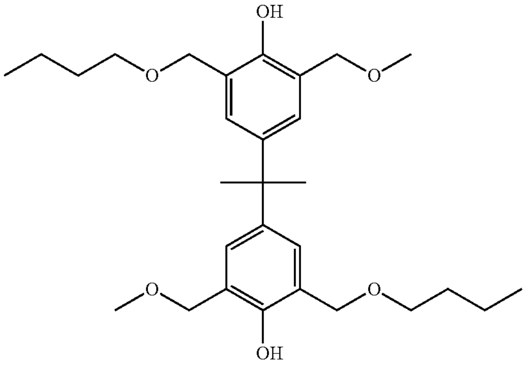
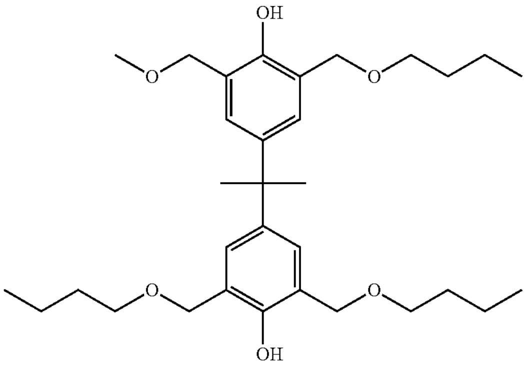
-continued
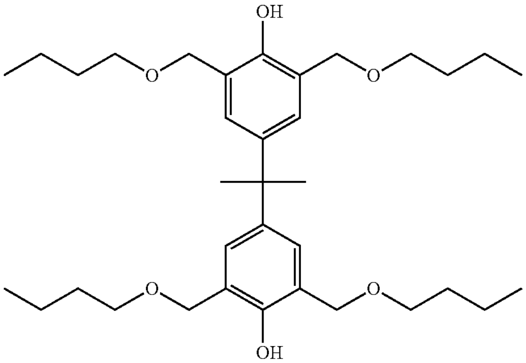
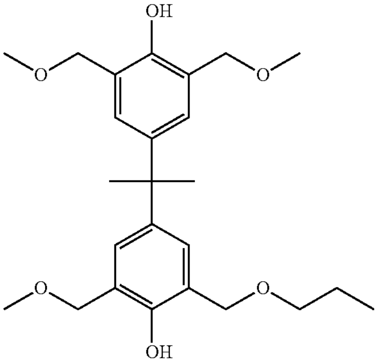
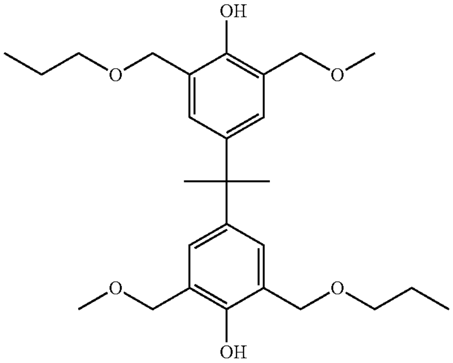
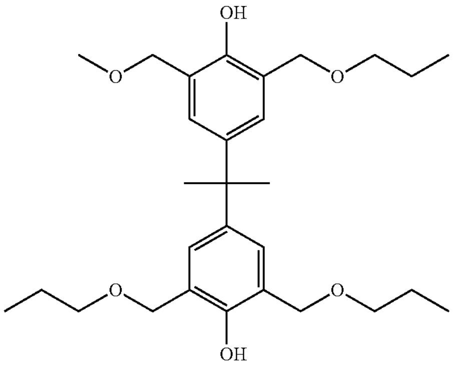

-continued
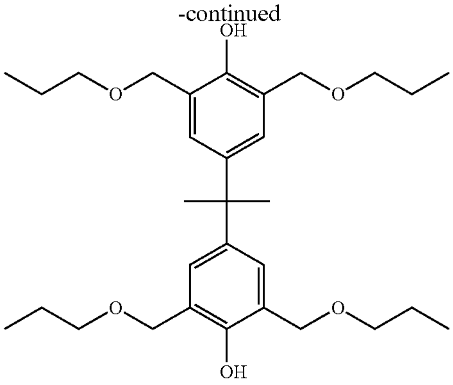
[Chem. 21]
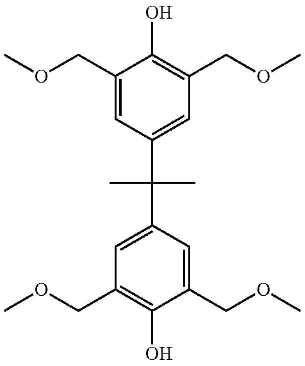
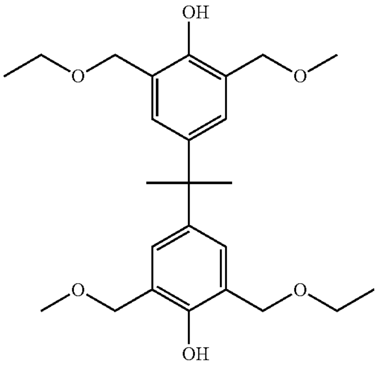
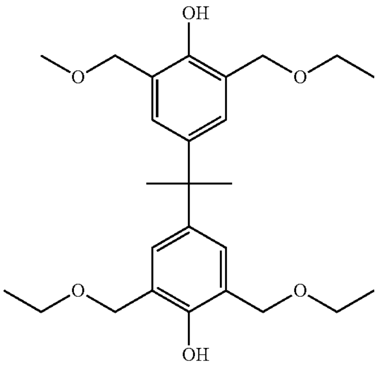
-continued
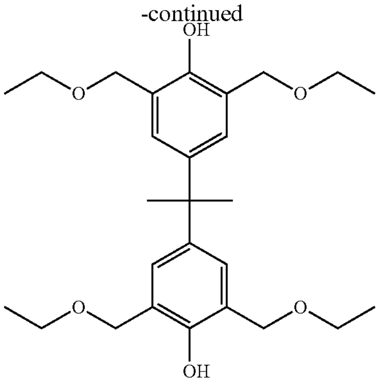
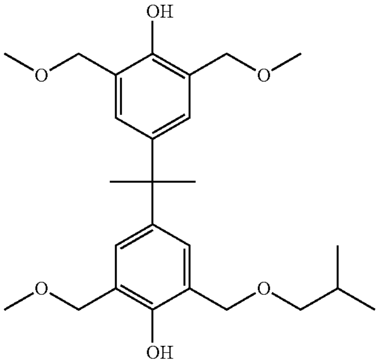
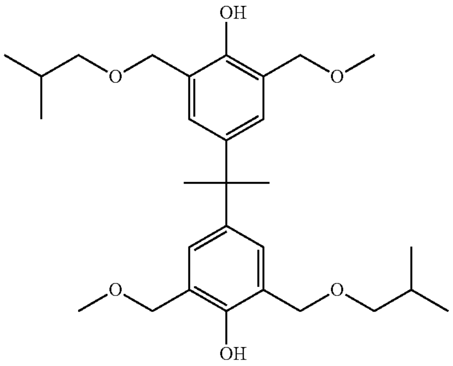
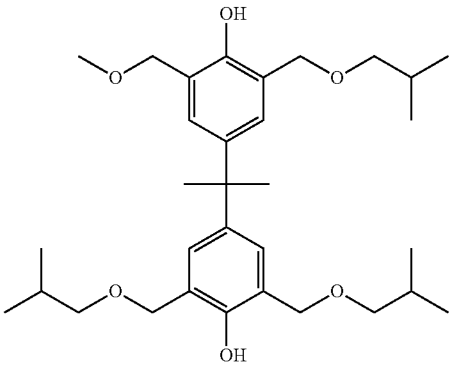

-continued
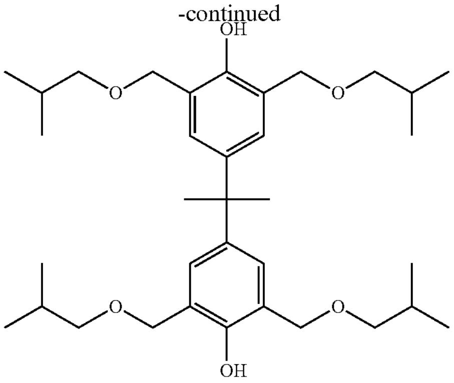
[Chem. 22]
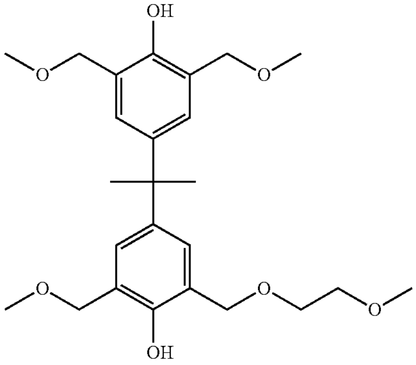
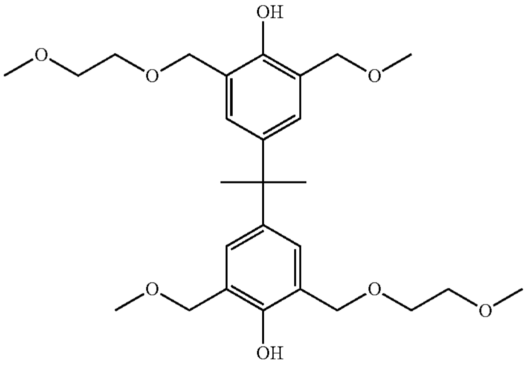
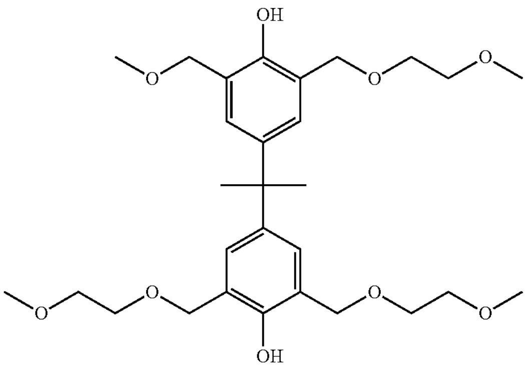
-continued
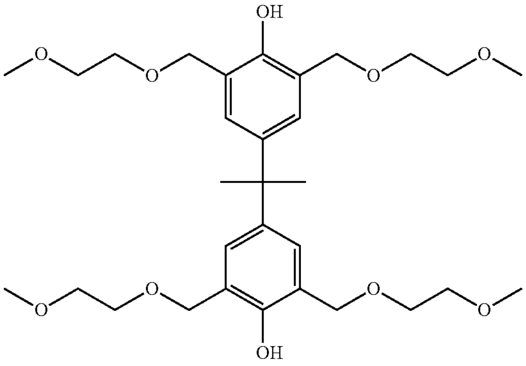
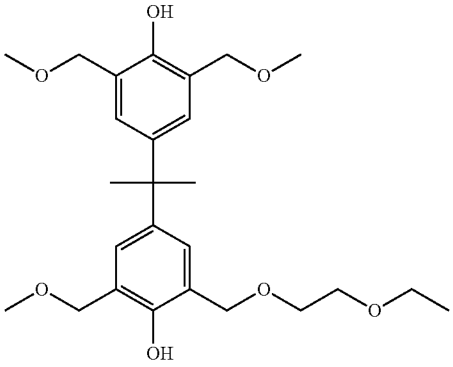
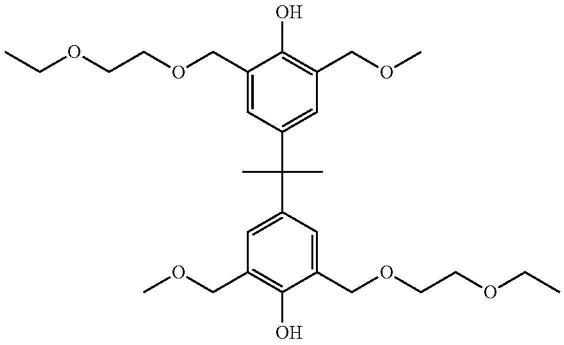
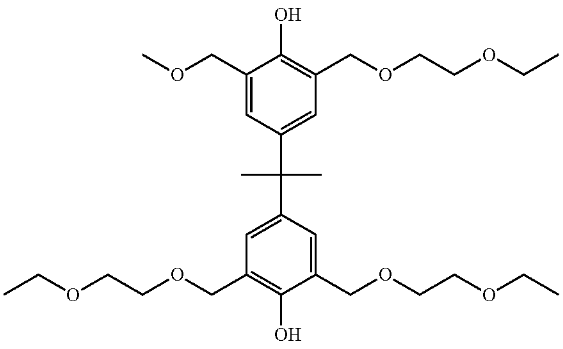

-continued
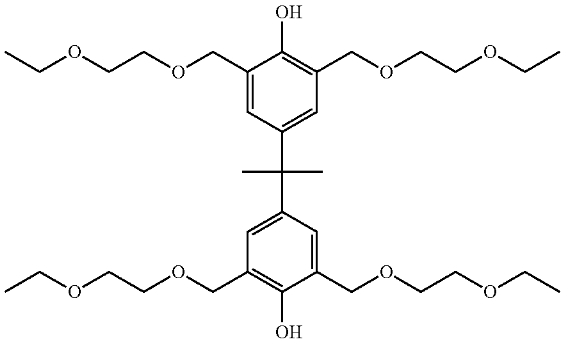
[Chem. 23]
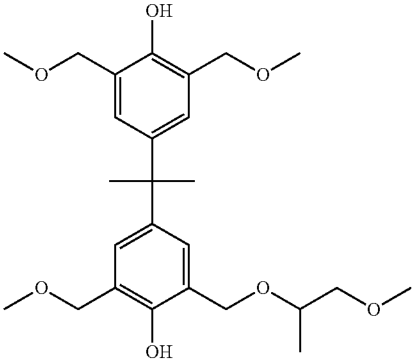
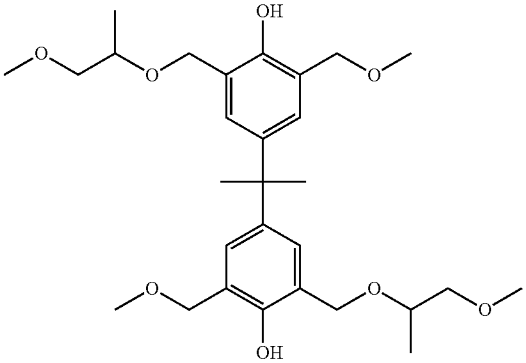
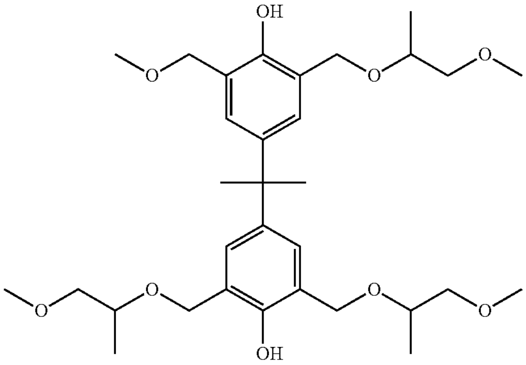
-continued
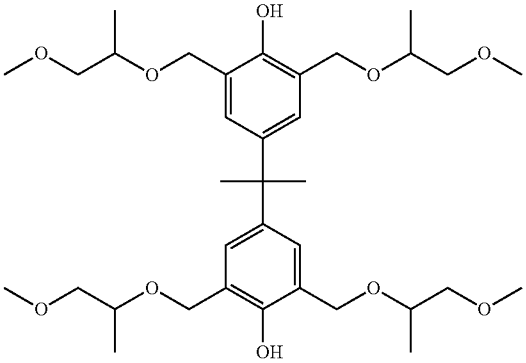
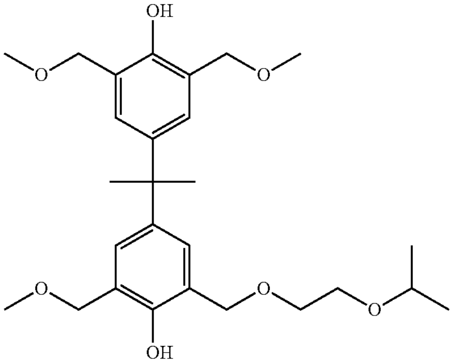
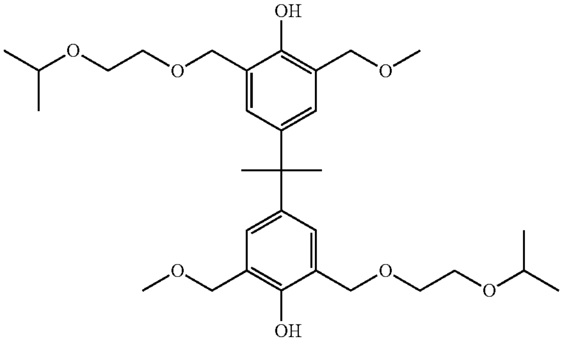
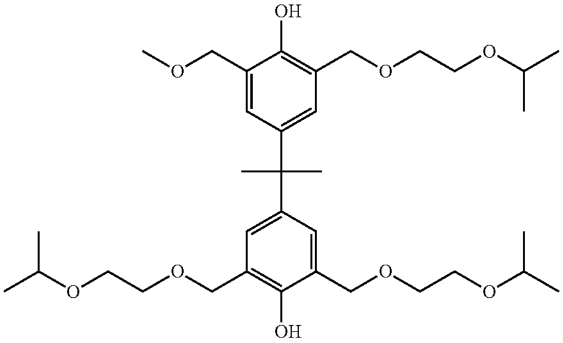

-continued
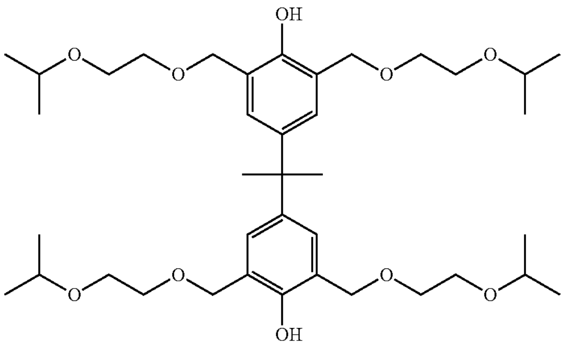
The compounds represented by Formula (G-3) and Formula (G-4) may be exemplified below.
[Chem. 24]
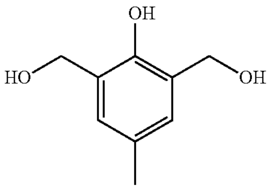
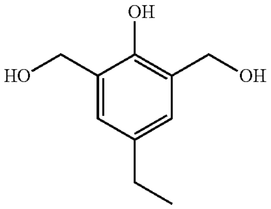
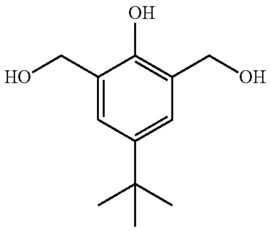
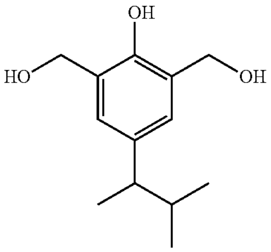
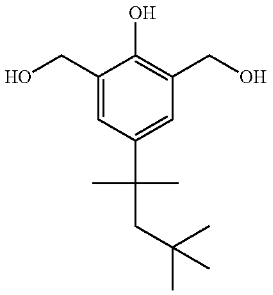
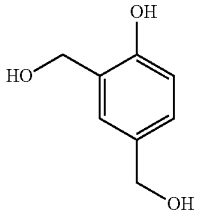
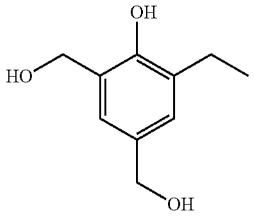
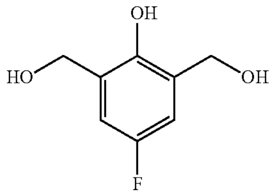
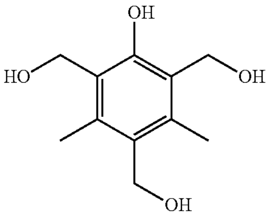
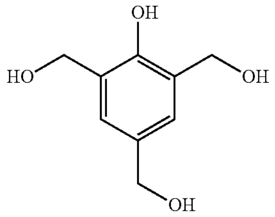
-continued
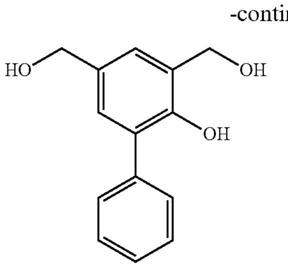
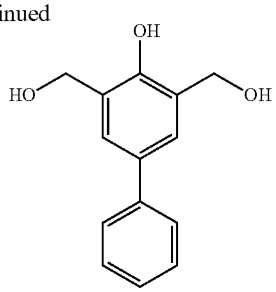
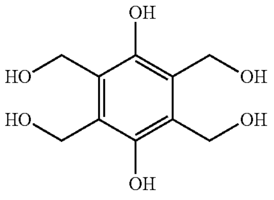
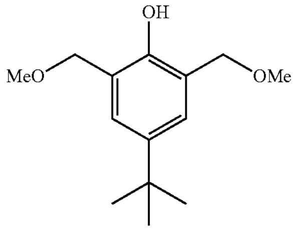
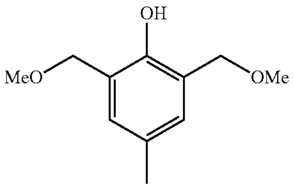
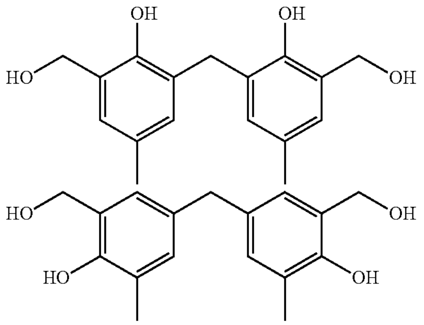
[Chem. 25]
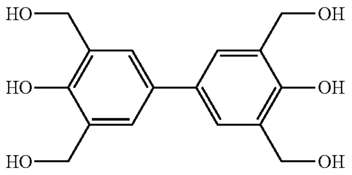
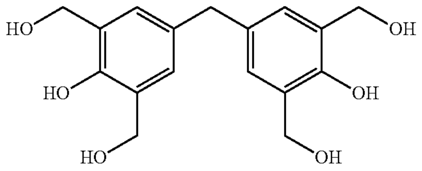
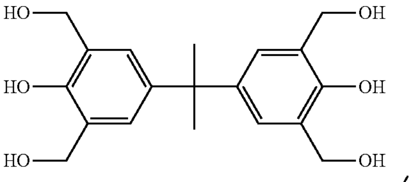
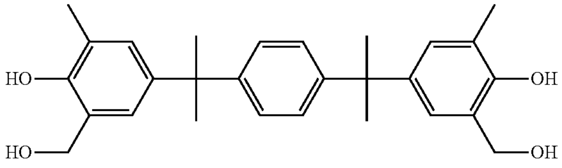

-continued

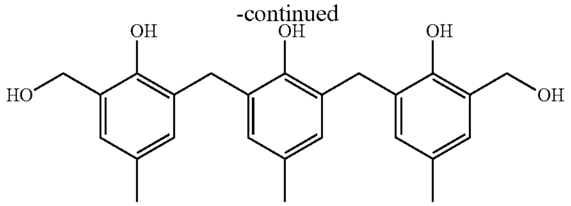
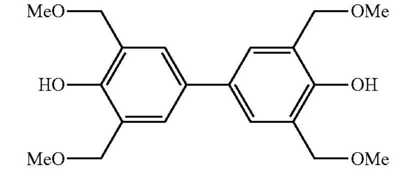
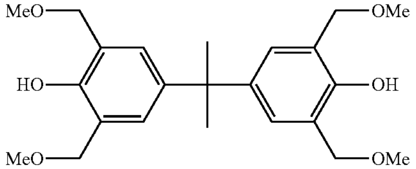
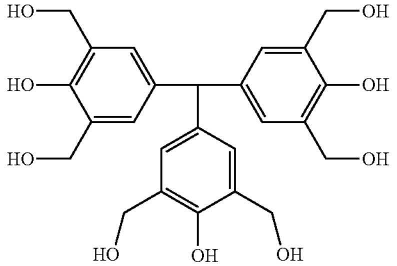
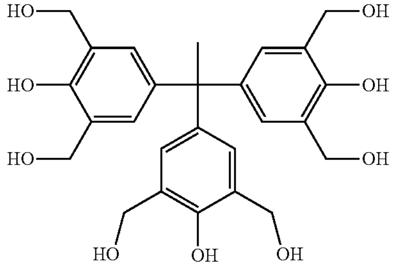
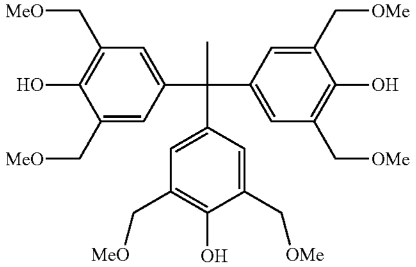

In the formula, Me represents a methyl group.

The entire disclosure of WO 2014/208542 A is incorporated in the present application by reference.

In a case where the crosslinking agent is used, it may be used in a content ratio of, for example, within the range of 1% by mass to 50% by mass, and preferably, 5% by mass to 30% by mass, with respect to the reaction product.

<Other Components>

In the resist underlayer film-forming composition of the present invention, there is no occurrence of pinholes, striations, or the like, and a surfactant may be further added in order to further improve the applicability for surface unevenness. Examples of the surfactant include nonionic surfactants such as polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants such as EFTOP EF301, EF303, and EF352 (manufactured by Tochem Products Co. Ltd., trade name), Megafac F171, F173, and R-30 (manufactured by Dainippon Ink Co., Ltd., trade name), Fluorad FC430 and FC431 (manufactured by Sumitomo 3M Limited, trade name), and AsahiGuard AG710 and Surflon S-382, SC101, SC102, SC103, SC104, SC105, and SC106 (manufactured by AGC Inc.), and Organosiloxane polymer KP341 (manufactured by Shin-Etsu Chemical Co., Ltd.). A blending amount of these surfactants is usually 2.0% by mass or less, and preferably 1.0% by mass or less, with respect to the total solid content of the resist underlayer film-forming composition of the present invention. These surfactants may be added each alone or in combination of two or more thereof.

The solid content contained in the resist underlayer film-forming composition of the present invention, that is, the components excluding the solvent, may be within the range of 0.01% by mass to 10% by mass, for example.

<Resist Underlayer Film>

The resist underlayer film according to the present invention may be manufactured by applying the resist underlayer film-forming composition described above onto a semiconductor substrate and performing baking.

Examples of the semiconductor substrate on which the resist underlayer film-forming composition of the present invention is applied include a silicon wafer, a germanium wafer, and a semiconductor wafer formed of a compound such as gallium arsenide, indium phosphide, gallium nitride, indium nitride, or aluminum nitride.

In a case where a semiconductor substrate having a surface on which an inorganic film is formed is used, the inorganic film may be formed by, for example, an atomic layer deposition (ALD) method, a chemical vapor deposition (CVD) method, a reactive sputtering method, an ion-plating method, a vacuum deposition method, or a spin coating method (spin on glass: SOG). Examples of the inorganic film include a polysilicon film, a silicon oxide film, a silicon nitride film, a Boro-Phospho Silicate Glass (BPSG) film, a titanium nitride film, a titanium nitride oxide film, a tungsten film, a gallium nitride film, and a gallium arsenide film.

The resist underlayer film-forming composition of the present invention is applied onto the semiconductor substrate by an appropriate application method such as a spinner or a coater. Thereafter, baking is performed using heating means such as a hot plate to form a resist underlayer film. The conditions for baking may appropriately be selected from a baking temperature of 100° C. to 400° C. and a baking time of 0.3 minutes to 60 minutes. Preferably, the baking temperature is 120° C. to 350° C. and the baking time is 0.5 minutes to 30 minutes, and more preferably, the baking temperature is 150° C. to 300° C. and the baking time is 0.8 minutes to 10 minutes.

A film thickness of a resist underlayer film to be formed may be, for example, 0.001 μm (1 nm) to 10 μm, 0.002 μm (2 nm) to 1 μm, 0.005 μm (5 nm) to 0.5 μm (500 nm), 0.001 μm (1 nm) to 0.05 μm (50 nm), 0.002 μm (2 nm) to 0.05 μm (50 nm), 0.003 μm (3 nm) to 0.05 μm (50 nm), 0.004 μm (4 nm) to 0.05 μm (50 nm), 0.005 μm (5 nm) to 0.05 μm (50 nm), 0.003 μm (3 nm) to 0.03 μm (30 nm), 0.003 μm (3 nm) to 0.02 μm (20 nm), 0.005 μm (5 nm) to 0.02 μm (20 nm), 0.002 μm (2 nm) to 0.01 μm (10 nm), 0.003 μm (3 nm) to 0.01 μm (10 nm), 0.002 μm (2 nm) to 0.006 μm (6 nm), 0.004 μm (4 nm), or 0.005 μm (5 nm). In a case where the temperature during baking is lower than the above range, crosslinking may become insufficient. On the other hand, when the temperature during the baking is higher than the above range, the resist underlayer film may be decomposed by heat.

<Method for Manufacturing Patterned Substrate and Method for Manufacturing Semiconductor Device>

A method for manufacturing a patterned substrate includes the following steps. Usually, a photoresist layer is formed on a resist underlayer film. A photoresist formed by performing application and baking on the resist underlayer film by a method known per se is not particularly limited as long as it is sensitive to the light used for exposure. Either a negative photoresist or a positive photoresist may be used. Examples of the photoresist include a positive photoresist formed of a novolac resin and 1,2-naphthoquinonediazide sulfonic acid ester, a chemically amplified photoresist formed of a binder having a group degradable by an acid to increase an alkali dissolution rate and a photoacid generator, a chemically amplified photoresist formed of a low-molecular-weight compound degradable by an acid to increase an alkali dissolution rate of the photoresist, an alkali-soluble binder, and a photoacid generator, a chemically amplified photoresist formed of a binder having a group degradable by an acid to increase an alkali dissolution rate, a low-molecular-weight compound degradable by an acid to increase an alkali dissolution rate of the photoresist, and a photoacid generator, and a resist containing metal elements. Examples thereof include V146G (trade name) manufactured by JSR Corporation, APEX-E (trade name) manufactured by Shipley Company L.L.C, PAR710 (trade name) manufactured by Sumitomo Chemical Co., Ltd., and AR2772 and SEPR430 (trade name) manufactured by Shin-Etsu Chemical Co., Ltd. In addition, examples thereof include a fluorine-containing atomic polymer-based photoresist as described in Proc. SPIE, Vol. 3999, 330-334 (2000), Proc. SPIE, Vol. 3999, 357-364 (2000), and Proc. SPIE, Vol. 3999, 365-374 (2000).

In addition, the resist compositions described in WO 2019/188595 A, WO 2019/187881 A, WO 2019/187803 A, WO 2019/167737 A, WO 2019/167725 A, WO 2019/187445 A, WO 2019/167419 A, WO 2019/123842 A, WO 2019/054282 A, WO 2019/058945 A, WO 2019/058890 A, WO 2019/039290 A, WO 2019/044259 A, WO 10 2019/044231 A, WO 2019/026549 A, WO 2018/193954 A, WO 2019/172054 A, WO 2019/021975 A, WO 2018/230334 A, WO 2018/194123 A, JP 2018-180525 A, WO 2018/190088 A, JP 2018-070596 A, JP 2018-028090 A, JP 2016-153409 A, JP 2016-130240 A, JP 2016-108325 A, JP 2016-047920 A, JP 2016-035570 A, JP 2016-035567 A, JP 2016-035565 A, JP 2019-101417 A, JP 2019-117373 A, JP 2019-052294 A, JP 15 2019-008280 A, JP 2019-008279 A, JP 2019-003176 A, JP 2019-003175 A, JP 2018-197853 A, JP 2019-191298 A, JP 2019-061217 A, JP 2018-045152 A, JP 2018-022039 A, JP 2016-090441 A, JP 2015-10878 A, JP 2012-168279 A, JP 2012-022261 A, JP 2012-022258 A, JP 2011-043749 A, JP 2010-181857 A, JP 2010-128369 A, WO 2018/031896 A, JP 2019-113855 A, WO 2017/156388 A, WO 2017/066319 A, JP 2018-41099 A, WO 2016/065120 A, WO 2015/026482 A, JP 2016-29498 A, JP 2011-253185 A, and the like, the so-called resist compositions such as a radiation-sensitive resin composition and a high-resolution patterning composition based on an organometallic solution, and a metal-containing resist composition may be used, but are not limited thereto.

Examples of the resist composition include the following compositions.

An active ray-sensitive or radiation-sensitive resin composition containing: a resin A having a repeating unit having an acid-decomposable group in which a polar group is protected by a protecting group that is desorbed by an action of an acid; and a compound represented by General Formula (21).

[Chem. 26]

(21)

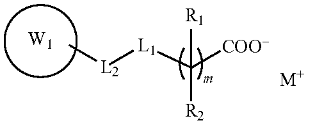

In General Formula (21), m represents an integer of 1 to 6.

$R_1$ and $R_2$ each independently represent a fluorine atom or a perfluoroalkyl group.

$L_1$ represents —O—, —S—, —COO—, —$SO_2$—, or —$SO_3$—.

$L_2$ represents an alkylene group which may have a substituent or a single bond.

$W_1$ represents a cyclic organic group which may have a substituent.

$M^+$ represents a cation.

A metal-containing film-forming composition for extreme ultraviolet ray or electron beam lithography, containing: a compound having a metal-oxygen covalent bond; and a solvent, in which metal elements constituting the compound belong to the third to seventh periods of Groups 3 to 15 of the periodic table.

A radiation-sensitive resin composition containing: a polymer having a first structural unit represented by the following Formula (31) and a second structural unit having an acid-dissociable group represented by the following Formula (32); and an acid generator.

[Chem. 27]

(31)

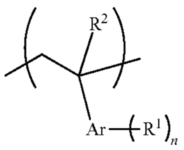

(32)

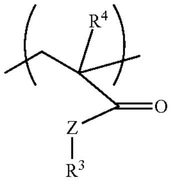

(In Formula (31), Ar is a group obtained by removing (n+1) hydrogen atoms from arene having 6 to 20 carbon atoms. $R^1$ is a hydroxy group, a sulfanyl group, or a monovalent organic group having 1 to 20 carbon atoms. n is an integer of 0 to 11. When n is 2 or more, a plurality of $R^1$'s are the same as or different from each other. $R^2$ is a hydrogen atom, a fluorine atom, a methyl group, or a trifluoromethyl group. In Formula (32), $R^3$ is a monovalent group having 1 to 20 carbon atoms which has the acid-dissociable group. Z is a single bond, an oxygen atom, or a sulfur atom. $R^4$ is a hydrogen atom, a fluorine atom, a methyl group, or a trifluoromethyl group.)

A resist composition containing: a resin (A1) having a structural unit having a cyclic carbonic acid ester structure, a structural unit represented by Formula (II), and a structural unit having an acid-unstable group; and an acid generator.

[Chem. 28]

(II)

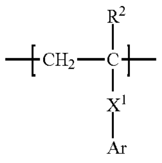

[In Formula (II), $R^2$ represents an alkyl group having 1 to 6 carbon atoms which may have a halogen atom, a hydrogen atom, or a halogen atom, $X^1$ represents a single bond, —CO—O—*, or —CO—$NR^4$—*, * represents a bond with Ar, $R^4$ represents a hydrogen atom or an alkyl group having 1 to 4 carbon atoms, and Ar represents an aromatic hydrocarbon group having 6 to 20 carbon atoms which may have one or more groups selected from the group consisting of a hydroxy group and a carboxyl group.]

Examples of the resist film include the following.

A resist film containing a base resin having a repeating unit represented by the following Formula (a1) and/or a repeating unit represented by the following Formula (a2), and a repeating unit that generates an acid bonded to a polymer main chain by exposure.

[Chem. 29]

(a1)

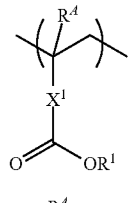

(a2)

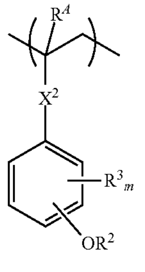

(In Formula (a1) and Formula (a2), $R^A$'s are each independently a hydrogen atom or a methyl group. $R^1$ and $R^2$ are each independently a tertiary alkyl group having 4 to 6 carbon atoms. $R^3$'s each independently represent a fluorine atom or a methyl group. m is an integer of 0 to 4. $X^1$ is a single bond, a phenylene group or a naphthylene group, or a linking group having 1 to 12 carbon atoms containing at least one member selected from an ester bond, a lactone ring, a phenylene group, and a naphthylene group. $X^2$ is a single bond, an ester bond, or an amide bond.)

Examples of a resist material include the following.

A resist material containing a polymer having a repeating unit represented by the following Formula (b1) or Formula (b2).

[Chem. 30]

(b1)

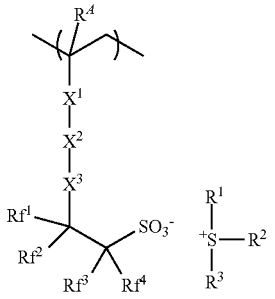

(b2)

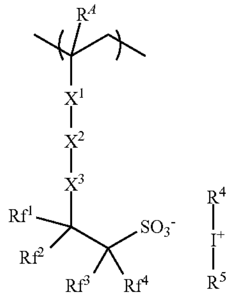

(In Formula (1) and Formula (b2), $R^A$ is a hydrogen atom or a methyl group. $X^1$ is a single bond or an ester group. $X^2$ is a linear, branched, or cyclic alkylene group having 1 to 12 carbon atoms or an arylene group having 6 to 10 carbon atoms, a part of a methylene group constituting the alkylene group may be substituted with an ether group, an ester group, or a lactone ring-containing group, and at least one hydrogen atom contained in $X^2$ is substituted with a bromine atom. $X^3$ is a single bond, an ether group, an ester group, or a linear, branched, or cyclic alkylene group having 1 to 12 carbon atoms, and a part of a methylene group constituting the alkylene group may be substituted with an ether group or an ester group. $Rf^1$ to $Rf^4$ are each independently a hydrogen atom, a fluorine atom, or a trifluoromethyl group, and at least one of $Rf^1$ to $Rf^4$ is a fluorine atom or a trifluoromethyl group. In addition, $Rf^1$ and $Rf^4$ may be combined to form a carbonyl group. $R^1$ to $R^5$ each independently represent a linear, branched, or cyclic alkyl group having 1 to 12 carbon atoms, a linear, branched, or cyclic alkenyl group having 2 to 12 carbon atoms, an alkynyl group having 2 to 12 carbon atoms, an aryl group having 6 to 20 carbon atoms, an aralkyl group having 7 to 12 carbon atoms, or an aryloxyalkyl group having 7 to 12 carbon atoms, some or all of the hydrogen atoms in these groups may be substituted with a hydroxy group, a carboxy group, a halogen atom, an oxo group, a cyano group, an amide group, a nitro group, a sultone group, a sulfone group, or a sulfonium salt-containing group, and a part of a methylene group constituting each of these groups may be substituted with an ether group, an ester group, a carbonyl group, a carbonate group, or a sulfonic acid ester group. In addition, $R^1$ and $R^2$ may be bonded to form a ring together with a sulfur atom to which they are bonded.)

A resist material containing a base resin containing a polymer having a repeating unit represented by the following Formula (a).

[Chem. 31]

(a)

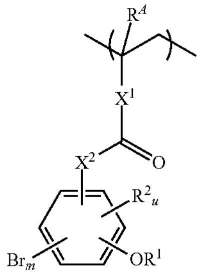

(In Formula (a), $R^A$ is a hydrogen atom or a methyl group. $R^1$ is a hydrogen atom or an acid-unstable group. $R^2$ is a linear, branched, or cyclic alkyl group having 1 to 6 carbon atoms or a halogen atom other than bromine. $X^1$ is a single bond or a phenylene group, or a linear, branched, or cyclic alkylene group having 1 to 12 carbon atoms which may contain an ester group or a lactone ring. $X^2$ is —O—, —O—$CH_2$—, or —NH—. m is an integer of 1 to 4. n is an integer of 0 to 3.)

A resist composition which generates an acid by exposure and has solubility in a developer that is changed by an action of the acid, the resist composition containing:

a base component (A) having solubility in a developer that is changed by an action of an acid; and a fluorine additive component (F) exhibiting decomposability in an alkaline developer, in which the fluorine additive component (F) contains a fluororesin component (F1) having a structural unit (f1) containing a base-dissociable group and a structural unit (f2) containing a group represented by the following General Formula (f2-r-1).

[Chem. 32]

(f2-r-1)

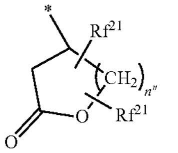

[In Formula (f2-r-1), $Rf^{21}$'s each independently represent a hydrogen atom, an alkyl group, an alkoxy group, a hydroxyl group, a hydroxyalkyl group, or a cyano group. n" is an integer of 0 to 2. * represents a bond.]

The structural unit (f1) includes a structural unit represented by the following General Formula (f1-1) or a structural unit represented by the following General Formula (f1-2).

[Chem. 33]

(f1-1)

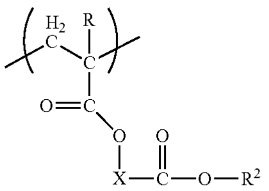

(f1-2)

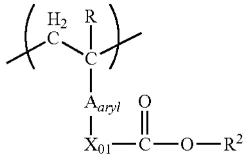

[In Formula (f1-1) and (f1-2), R's are each independently a hydrogen atom, an alkyl group having 1 to 5 carbon atoms, or a halogenated alkyl group having 1 to 5 carbon atoms. X is a divalent linking group having no acid-dissociable site. $A_{aryl}$ is a divalent aromatic cyclic group which may have a substituent. $X_{01}$ is a single bond or a divalent linking group. $R^2$'s are each independently an organic group having a fluorine atom.]

Examples of the coating, the coating solution, and the coating composition include the following.

A coating containing a metal oxo-hydroxo network having an organic ligand by a metal carbon bond and/or a metal carboxylate bond.

Inorganic oxo/hydroxo-based composition.

A coating solution containing: an organic solvent; a first organometallic composition represented by Formula $R_2SnO_{(2-(z/2)-(x/2))}(OH)_x$ (where $0<z\leq2$ and $0<(z+x)\leq4$), Formula $R'_nSnX_{4-n}$ (where n=1 or 2), or a mixture thereof, where R and R' are independently a hydrocarbyl group having 1 to 31 carbon atoms, and X is a ligand having a hydrolyzable bond to Sn or a combination thereof; and a hydrolyzable metal compound represented by $MX'_v$ (where M is a metal selected from Groups 2 to 16 of the periodic table of the elements, v=number of 2 to 6, and X' is a ligand having a hydrolyzable M-X bond or a combination thereof).

A coating solution containing: an organic solvent; and a first organometallic composition represented by Formula $RSnO_{(3/2-x/2)}(OH)_x$ (in the formula, $0<x<3$), in which about 0.0025 M to about 1.5 M tin is contained in the solution, R is an alkyl group or cycloalkyl group having 3 to 31 carbon atoms, and the alkyl group or cycloalkyl group is bonded to tin at a secondary or tertiary carbon atom.

An inorganic pattern forming precursor aqueous solution containing a mixture of water, a metal suboxide cation, a polyatomic inorganic anion, and a radiation-sensitive ligand containing a peroxide group.

The exposure is performed through a mask (reticle) for forming a predetermined pattern, and for example, an i-line, a KrF energy laser, an ArF energy laser, an extreme ultraviolet ray (EUV), or an electron beam (EB) is used, but the resist underlayer film-forming composition of the present application is preferably applied for electron beam (EB) or extreme ultraviolet ray (EUV) exposure, and more preferably for extreme ultraviolet ray (EUV) exposure. In the development, an alkaline developer is used, and a development temperature and a development time are appropriately selected from 5° C. to 50° C. and 10 seconds to 300 seconds, respectively. As the alkaline developer, for example, aqueous solutions of alkalis, for example, inorganic alkalis such as sodium hydroxide, potassium hydroxide, sodium carbonate, sodium silicate, sodium metasilicate, and ammonia water, primary amines such as ethylamine and n-propylamine, secondary amines such as diethylamine and di-n-butyl amine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, and cyclic amines such as pyrrole and piperidine, may be used. Furthermore, an appropriate amount of alcohols such as isopropyl alcohol and a surfactant such as a nonionic surfactant may be added to the aqueous solution of alkalis. Of these, a preferred developer is a quaternary ammonium salt and more preferably tetramethylammonium hydroxide and choline. Furthermore, a surfactant or the like may be added to the developer. Instead of the alkaline developer, a method of performing development with an organic solvent such as butyl acetate and developing a portion where an alkali dissolution rate of the photoresist is not increased may also be used. Through the above steps, a substrate on which the resist is patterned can be manufactured.

Next, the resist underlayer film is dry-etched using the formed resist pattern as a mask. At this time, in a case where the inorganic film is formed on the surface of the used semiconductor substrate, when the inorganic film is not formed on the surface of the used semiconductor substrate by exposing the surface of the inorganic film, the surface of the semiconductor substrate is exposed. Thereafter, the semiconductor device can be manufactured through a step of processing the substrate by a method known per se (a dry etching method or the like).

EXAMPLES

Next, the content of the present invention will be described in detail with reference to Examples, but the present invention is not limited thereto.

A weight average molecular weight of a polymer described in Synthesis Examples of the present specification is a result of measurement by gel permeation chromatography (hereinafter, abbreviated as GPC). For the measurement, a GPC apparatus manufactured by Tosoh Corporation is used, and the measurement conditions and the like are as follows.

GPC column: Shodex KF803L, Shodex KF802, Shodex KF801 [registered trademark] (Showa Denko K. K.)

Column temperature: 40° C.

Solvent: tetrahydrofuran (THF)

Flow rate: 1.0 ml/min

Standard sample: polystyrene (manufactured by Tosoh Corporation)

Synthesis Example 1

A polymer 1 was synthesized as follows. 5.67 g of N,N-diglycidyl-5,5-dimethylhydantoin (manufactured by Shikoku Chemicals Corporation), 3.40 g of monoallyl isocyanuric acid (manufactured by Shikoku Chemicals Corporation), 0.58 g of N-(tert-butoxycarbonyl)-L-glutamic acid (manufactured by Tokyo Chemical Industry Co., Ltd.), and 0.35 g of ethyltriphenylphosphonium bromide (manufactured by Tokyo Chemical Industry Co., Ltd.) were added to and dissolved in 40.0 g of propylene glycol monomethyl ether. The inside of a reaction vessel was replaced with nitrogen, and then a reaction was allowed to proceed at 110° C. for 24 hours, thereby obtaining a polymer solution. GPC analysis showed that the obtained polymer had a weight average molecular weight of 5,500 in terms of standard polystyrene, and a polydispersity of 4.3. The repeating unit structure present in the polymer 1 is shown in the following formula.

[Chem. 34]

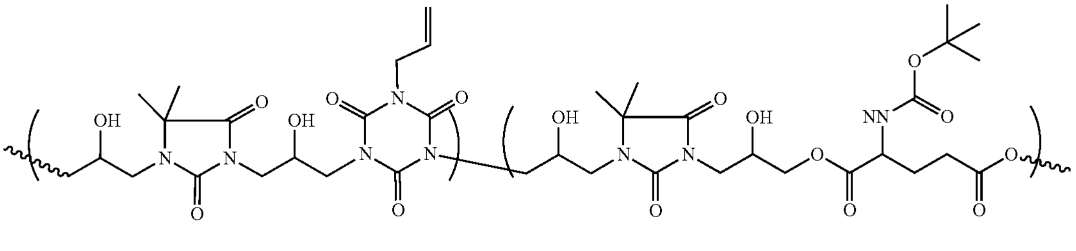

Synthesis Example 2

A polymer 2 was synthesized as follows. 8.00 g of monoallyl diglycidyl isocyanurate (manufactured by Shikoku Chemicals Corporation), 5.41 g of diethylbarbituric acid (manufactured by Tokyo Chemical Industry Co., Ltd.), 0.71 g of N-(tert-butoxycarbonyl)-glutamic acid (manufactured by Tokyo Chemical Industry Co., Ltd.), and 0.42 g of ethyltriphenylphosphonium bromide (manufactured by Tokyo Chemical Industry Co., Ltd.) were added to and dissolved in 20.9 g of propylene glycol monomethyl ether. The inside of a reaction vessel was replaced with nitrogen, and then a reaction was allowed to proceed at 110° C. for 24 hours, thereby obtaining a polymer solution. GPC analysis showed that the obtained polymer had a weight average molecular weight of 6,500 in terms of standard polystyrene, and a polydispersity of 4.1. The repeating unit structure present in the polymer 2 is shown in the following formula.

[Chem. 35]

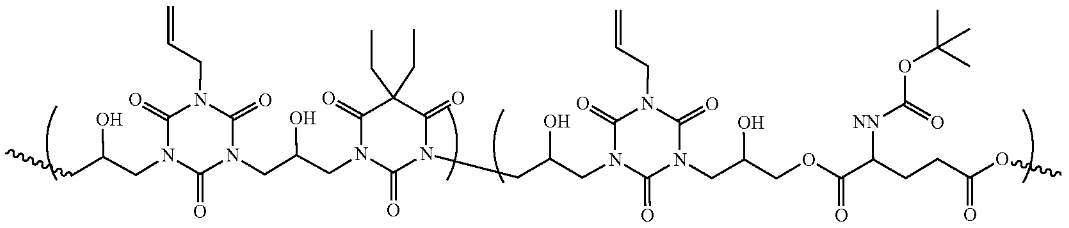

Synthesis Example 3

A polymer 3 was synthesized as follows. 8.00 g of monoallyl diglycidyl isocyanurate (manufactured by Shikoku Chemicals Corporation), 5.41 g of diethylbarbituric acid (manufactured by Tokyo Chemical Industry Co., Ltd.), 0.71 g of N-[(9H-fluoren-9-ylmethoxy)carbonyl]-aspartic acid (manufactured by Tokyo Chemical Industry Co., Ltd.), and 0.42 g of ethyltriphenylphosphonium bromide (manufactured by Tokyo Chemical Industry Co., Ltd.) were added to and dissolved in 20.9 g of propylene glycol monomethyl ether. The inside of a reaction vessel was replaced with nitrogen, and then a reaction was allowed to proceed at 110° C. for 24 hours, thereby obtaining a polymer solution. GPC analysis showed that the obtained polymer had a weight average molecular weight of 6,000 in terms of standard polystyrene, and a polydispersity of 4.5. The repeating unit structure present in the polymer 3 is shown in the following formula.

[Chem. 36]

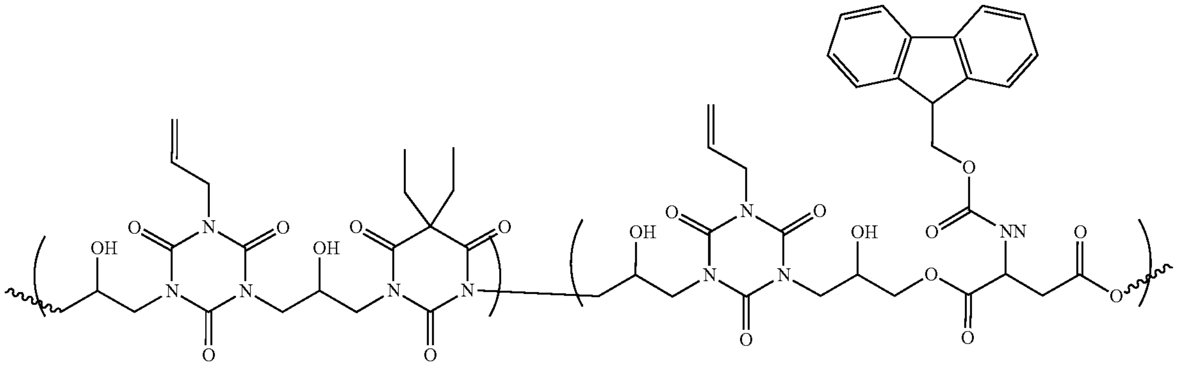

Synthesis Example 4

A polymer 4 was synthesized as follows. 11.29 g of monoallyl diglycidyl isocyanurate (manufactured by Shikoku Chemicals Corporation), 6.32 g of diethylbarbituric acid (manufactured by Tokyo Chemical Industry Co., Ltd.), 2.29 g of N-(tert-butoxycarbonyl)β-alanine (manufactured by Tokyo Chemical Industry Co., Ltd.), and 0.60 g of ethyltriphenylphosphonium bromide (manufactured by Tokyo Chemical Industry Co., Ltd.) were added to and dissolved in 21.5 g of propylene glycol monomethyl ether. The inside of a reaction vessel was replaced with nitrogen, and then a reaction was allowed to proceed at 110° C. for 24 hours, thereby obtaining a polymer solution. GPC analysis showed that the obtained polymer had a weight average molecular weight of 4,000 in terms of standard polystyrene, and a polydispersity of 3.7. The repeating unit structure and the terminal structure present in the polymer 4 are shown in the following formula.

[Chem. 37]

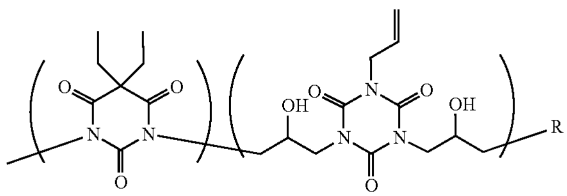

-continued

R =

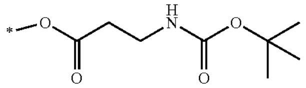

(In the formula, * represents a binding site with the terminal of the polymer.)

Synthesis Example 5

A polymer 5 was synthesized as follows. 11.00 g of monoallyl diglycidyl isocyanurate (manufactured by Shikoku Chemicals Corporation), 6.41 g of 3,3'-dithiodipropionic acid (manufactured by Tokyo Chemical Industry Co., Ltd.), 2.04 g of N-(tert-butoxycarbonyl)-B-alanine (manufactured by Tokyo Chemical Industry Co., Ltd.), and 0.53 g of ethyltriphenylphosphonium bromide (manufactured by Tokyo Chemical Industry Co., Ltd.) were added to and dissolved in 20.9 g of propylene glycol monomethyl ether. The inside of a reaction vessel was replaced with nitrogen, and then a reaction was allowed to proceed at 110° C. for 24 hours, thereby obtaining a polymer solution. GPC analysis showed that the obtained polymer had a weight average molecular weight of 4,000 in terms of standard polystyrene, and a polydispersity of 3.7. The repeating unit structure and the terminal structure present in the polymer 5 are shown in the following formula.

[Chem. 38]

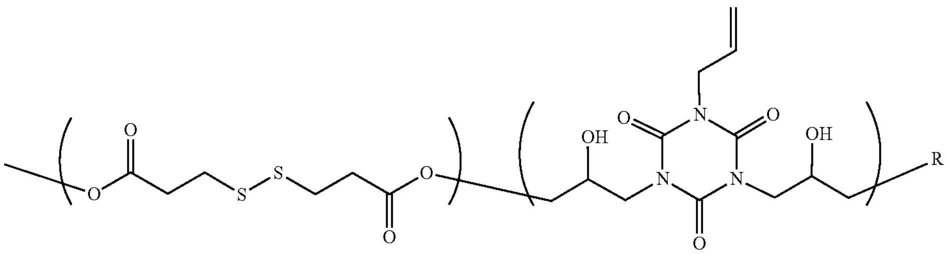

R =

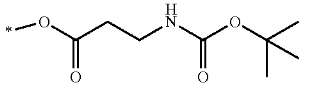

(In the formula, * represents a binding site with the terminal of the polymer.)

Synthesis Example 6

A polymer 6 was synthesized as follows. 11.80 g of monoallyl diglycidyl isocyanurate (manufactured by Shikoku Chemicals Corporation), 6.60 g of diethylbarbituric acid (manufactured by Tokyo Chemical Industry Co., Ltd.), 2.72 g of 4-(tert-butoxycarbonylamino)benzoic acid (manufactured by Tokyo Chemical Industry Co., Ltd.), and 0.63 g of ethyltriphenylphosphonium bromide (manufactured by Tokyo Chemical Industry Co., Ltd.) were added to and dissolved in 23.5 g of propylene glycol monomethyl ether. The inside of a reaction vessel was replaced with nitrogen, and then a reaction was allowed to proceed at 110° C. for 24 hours, thereby obtaining a polymer solution. GPC analysis showed that the obtained polymer had a weight average molecular weight of 4,500 in terms of standard polystyrene, and a polydispersity of 3.9. The repeating unit structure and the terminal structure present in the polymer 6 are shown in the following formula.

[Chem. 39]

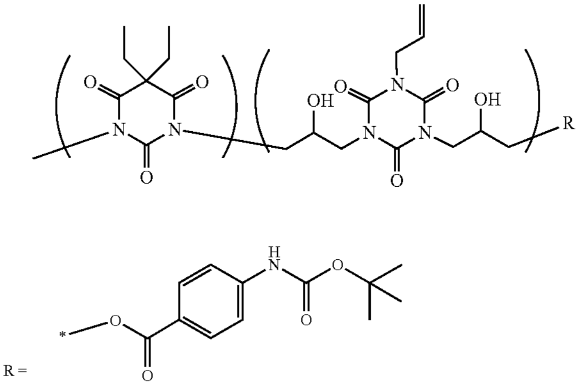

(In the formula, * represents a binding site with the terminal of the polymer.)

Synthesis Example 7

A polymer 7 was synthesized as follows. 11.80 g of monoallyl diglycidyl isocyanurate (manufactured by Shikoku Chemicals Corporation), 6.60 g of diethylbarbituric acid (manufactured by Tokyo Chemical Industry Co., Ltd.), 2.72 g of N-(tert-butoxycarbonyl)proline (manufactured by Tokyo Chemical Industry Co., Ltd.), and 0.63 g of ethyltriphenylphosphonium bromide (manufactured by Tokyo Chemical Industry Co., Ltd.) were added to and dissolved in 23.5 g of propylene glycol monomethyl ether. The inside of a reaction vessel was replaced with nitrogen, and then a reaction was allowed to proceed at 110° C. for 24 hours, thereby obtaining a polymer solution. GPC analysis showed that the obtained polymer had a weight average molecular weight of 4,500 in terms of standard polystyrene, and a polydispersity of 3.9. The repeating unit structure and the terminal structure present in the polymer 7 are shown in the following formula.

[Chem. 40]

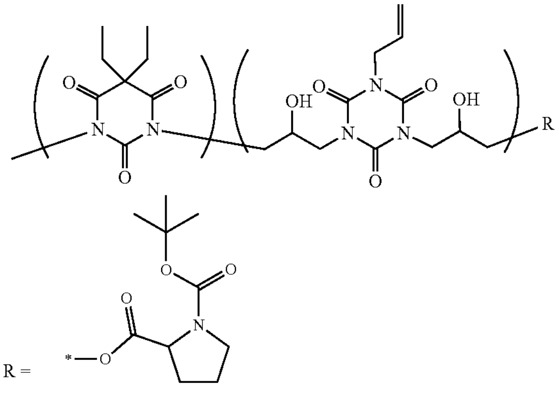

(In the formula, * represents a binding site with the terminal of the polymer.)

Synthesis Example 8

A polymer 8 was synthesized as follows. 5.21 g of N,N-diglycidyl-5, 5-dimethylhydantoin (manufactured by Shikoku Chemicals Corporation), 3.12 g of monoallyl isocyanuric acid (manufactured by Shikoku Chemicals Corporation), 1.35 g of N-[(9H-fluoren-9-ylmethoxy)carbonyl] alanine (manufactured by Tokyo Chemical Industry Co., Ltd.), and 0.32 g of ethyltriphenylphosphonium bromide (manufactured by Tokyo Chemical Industry Co., Ltd.) were added to and dissolved in 40.0 g of propylene glycol monomethyl ether. The inside of a reaction vessel was replaced with nitrogen, and then a reaction was allowed to proceed at 110° C. for 24 hours, thereby obtaining a polymer solution. GPC analysis showed that the obtained polymer had a weight average molecular weight of 4,500 in terms of standard polystyrene, and a polydispersity of 3.9. The repeating unit structure and the terminal structure present in the polymer 8 are shown in the following formula.

[Chem. 41]

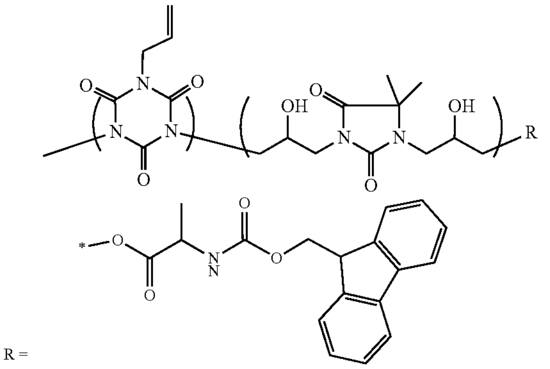

(In the formula, * represents a binding site with the terminal of the polymer.)

Synthesis Example 9

A polymer 9 was synthesized as follows. 15.01 g of monoallyl diglycidyl isocyanurate (manufactured by Shikoku Chemicals Corporation), 8.28 g of 5-hydroxyisophthalic acid (manufactured by Tokyo Chemical Industry Co., Ltd.), 3.03 g of N-(tert-butoxycarbonyl)-β-alanine (manufactured by Tokyo Chemical Industry Co., Ltd.), and 0.68 g of ethyltriphenylphosphonium bromide (manufactured by Tokyo Chemical Industry Co., Ltd.) were added to and dissolved in 21.5 g of propylene glycol monomethyl ether. The inside of a reaction vessel was replaced with nitrogen, and then a reaction was allowed to proceed at 110° C. for 24 hours, thereby obtaining a polymer solution. GPC analysis showed that the obtained polymer had a weight average molecular weight of 4,800 in terms of standard polystyrene, and a polydispersity of 3.5. The repeating unit structure and the terminal structure present in the polymer 9 are shown in the following formula.

[Chem. 42]

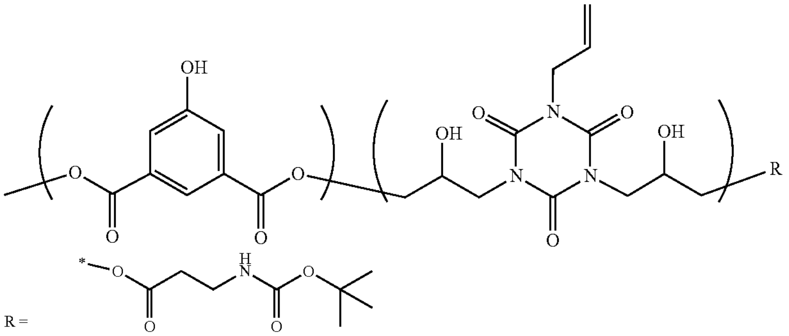

(In the formula, * represents a binding site with the terminal of the polymer.)

<Comparative Synthesis Example 1>

A polymer 10 was synthesized as follows. 14.82 g of monoallyl diglycidyl isocyanurate (manufactured by Shikoku Chemicals Corporation), 9.76 g of diethylbarbituric acid (manufactured by Tokyo Chemical Industry Co., Ltd.), and 0.79 g of ethyltriphenylphosphonium bromide (manufactured by Tokyo Chemical Industry Co., Ltd.) were added to and dissolved in 24.63 g of propylene glycol monomethyl ether. The inside of a reaction vessel was replaced with nitrogen, and then a reaction was allowed to proceed at 110° C. for 24 hours, thereby obtaining a polymer solution. GPC analysis showed that the obtained polymer had a weight average molecular weight of 9,000 in terms of standard polystyrene, and a polydispersity of 4.5. The repeating unit structure present in the polymer 10 is shown in the following formula.

[Chem. 43]

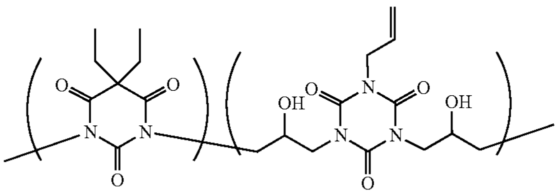

Comparative Synthesis Example 2

A polymer 11 was synthesized as follows. 25.00 g of monoallyl diglycidyl isocyanurate (manufactured by Shikoku Chemicals Corporation), 15.86 g of dithiodipropionic acid (manufactured by Tokyo Chemical Industry Co., Ltd.), and 1.13 g of tetrabutylphosphonium bromide (manufactured by Tokyo Chemical Industry Co., Ltd.) were added to and dissolved in 57.12 g of propylene glycol monomethyl ether. The inside of a reaction vessel was replaced with nitrogen, and then a reaction was allowed to proceed at 110° C. for 24 hours, thereby obtaining a polymer solution. GPC analysis showed that the obtained polymer had a weight average molecular weight of 6,000 in terms of standard polystyrene, and a polydispersity of 4.3. The repeating unit structure present in the polymer 11 is shown in the following formula.

[Chem. 44]

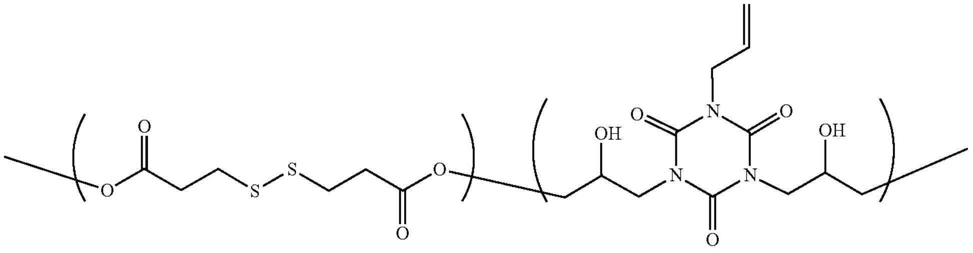

(Preparation of Resist Underlayer Film)

Each of the polymers obtained in Synthesis Examples 1 to 9 and Comparative Synthesis Examples 1 and 2, a cross-linking agent, a curing catalyst, and a solvent were mixed at proportions as shown in Table 1, and the mixtures were filtered through a 0.1 μm fluororesin filter, thereby preparing solutions of resist underlayer film-forming compositions, respectively.

In Table 1, tetramethoxymethyl glycoluril (manufactured by Nihon Cytec Industries Inc.) was abbreviated as PL-LI; pyridinium p-toluenesulfonic acid was abbreviated as PyPTS; pyridinium p-hydroxybenzenesulfonic acid was abbreviated as PyPSA; propylene glycol monomethyl ether acetate was abbreviated as PGMEA; and propylene glycol monomethyl ether was abbreviated as PGME. Each addition amount was shown in part(s) by mass.

TABLE 1

| | Polymer | Crosslinking agent | Curing catalyst | Solvent | |
|---|---|---|---|---|---|
| Example 1 | Synthesis Example 1 | PL-LI | PyPSA | PGMEA | PGME |
| (parts by mass) | 0.15 | 0.04 | 0.01 | 90 | 10 |
| Example 2 | Synthesis Example 1 | PL-LI | PyPTS | PGMEA | PGME |
| (parts by mass) | 0.15 | 0.04 | 0.01 | 90 | 10 |
| Example 3 | Synthesis Example 2 | PL-LI | PyPTS | PGMEA | PGME |
| (parts by mass) | 0.15 | 0.04 | 0.01 | 90 | 10 |
| Example 4 | Synthesis Example 3 | PL-LI | PyPTS | PGMEA | PGME |
| (parts by mass) | 0.15 | 0.04 | 0.01 | 90 | 10 |
| Example 5 | Synthesis Example 4 | PL-LI | PyPTS | PGMEA | PGME |
| (parts by mass) | 0.15 | 0.04 | 0.01 | 90 | 10 |
| Example 6 | Synthesis Example 5 | PL-LI | PyPTS | PGMEA | PGME |

TABLE 1-continued

| | Polymer | Crosslinking agent | Curing catalyst | Solvent | |
|---|---|---|---|---|---|
| (parts by mass) | 0.15 | 0.04 | 0.01 | 90 | 10 |
| Example 7 | Synthesis Example 6 | PL-LI | PyPTS | PGMEA | PGME |
| (parts by mass) | 0.15 | 0.04 | 0.01 | 90 | 10 |
| Example 8 | Synthesis Example 7 | PL-LI | PyPTS | PGMEA | PGME |
| (parts by mass) | 0.15 | 0.04 | 0.01 | 90 | 10 |
| Example 9 | Synthesis Example 8 | PL-LI | PyPTS | PGMEA | PGME |
| (parts by mass) | 0.15 | 0.04 | 0.01 | 90 | 10 |
| Example 10 | Synthesis Example 9 | PL-LI | PyPTS | PGMEA | PGME |
| (parts by mass) | 0.15 | 0.04 | 0.01 | 90 | 10 |

TABLE 2

| | Polymer | Crosslinking agent | Curing catalyst | Solvent | |
|---|---|---|---|---|---|
| Comparative Example 1 | Comparative Synthesis Example 1 | PL-LI | PyPTS | PGMEA | PGME |
| (parts by mass) | 0.15 | 0.04 | 0.01 | 90 | 10 |
| Comparative Example 2 | Comparative Synthesis Example 2 | PL-LI | PyPTS | PGMEA | PGME |
| (parts by mass) | 0.15 | 0.04 | 0.01 | 70 | 30 |

[Elution Test in Photoresist Solvent]

Each of the resist underlayer film-forming compositions of Examples 1 to 9 and Comparative Examples 1 and 2 was applied onto a silicon wafer using a spinner. The silicon wafer was baked on a hot plate at 205° C. for 60 seconds to obtain a film having a film thickness of 5 nm. These resist underlayer films were immersed in a mixed solution of propylene glycol monomethyl ether/propylene glycol monomethyl ether acetate=70/30, which was a solvent used for photoresists. It was confirmed that these resist underlayer films were insoluble in the solvent.

[Formation of Resist Pattern by KrF Exposure]

An antireflection film DUV-30J (manufactured by Nissan Chemical Industries, Ltd.) for KrF exposure was applied onto a silicon wafer using a spinner, and baking was performed on a hot plate at 205° C. for 60 seconds, thereby obtaining a film having a film thickness of 18 nm. Each of the resist underlayer film-forming compositions of Examples 1 to 9 and Comparative Examples 1 and 2 was applied onto a silicon wafer on the film using a spinner. The silicon wafer was baked on a hot plate at 205° C. for 60 seconds to obtain a resist underlayer film having a film thickness of 5 nm. SEPR-430 (manufactured by Shin-Etsu Chemical Co., Ltd.) as a positive resist solution for KrF excimer laser was spin-coated on the resist underlayer film, and heating was performed at 100° C. for 60 seconds, thereby forming a KrF resist film. The resist film was exposed under the predetermined conditions using an exposure apparatus for KrF excimer laser (manufactured by Nikon Corporation, NSR$^{5205}$C). After the exposure, post-exposure bake (PEB) was performed at 110° C. for 60 seconds. Then, paddle development was performed for 60 seconds using a 2.38% tetramethylammonium hydroxide aqueous solution (manufactured by TOKYO OHKA KOGYO CO., LTD., trade name: NMD-3) as a photoresist developer. Of the obtained photoresist pattern, those with a photoresist pattern free from occurrence of large pattern peeling were evaluated as good.

TABLE 3

| | |
|---|---|
| Example 1 | Good (straight) |
| Example 2 | Good (straight) |
| Example 3 | Good (straight) |
| Example 4 | Good (straight) |
| Example 5 | Good (straight) |
| Example 6 | Good (straight) |
| Example 7 | Good (straight) |
| Example 8 | Good (straight) |
| Example 9 | Good (straight) |
| Comparative Example 1 | Good (under cut) |
| Comparative Example 2 | Poor (pattern collapse) |

[Formation of Positive Resist Pattern by Electron Beam Drawing Apparatus]

Each of the resist underlayer film-forming compositions of Examples 1 to 10 and Comparative Example 1 was applied onto a silicon wafer using a spinner. The silicon wafer was baked on a hot plate at 215° C. for 60 seconds to obtain a resist underlayer film having a film thickness of 5 nm. A positive resist solution for EUV was spin-coated on the resist underlayer film, and heating was performed at 100° C. for 60 seconds, thereby forming an EUV resist film. The resist film was exposed under the predetermined conditions using an electron beam drawing apparatus (ELS-G130). After the exposure, the film was baked (PEB) at 110° C. for 60 seconds, cooled on a cooling plate to room temperature, and developed with an alkaline developer (2.38% TMHA), to form a resist pattern with a 20 nm line/40 nm pitch. For measuring the length of the resist pattern, a scanning electron microscope (manufactured by Hitachi High-Technologies Corporation, CG4100) was used. The exposure amount at which a 20 nm line/40 nm pitch (line-and-space (L/S=1/1)) was formed in the formation of the resist pattern was defined as an optimum exposure amount.

The photoresist pattern thus obtained was observed from the above of the pattern, and the minimum line width at which no collapse of the pattern was observed was expressed as the limiting resolution.

TABLE 4

| Example No. | Limiting resolution (nm) |
|---|---|
| Example 1 | 15.8 |
| Example 2 | 15.8 |
| Example 3 | 15.8 |
| Example 4 | 17.1 |
| Example 5 | 16.4 |
| Example 6 | 16.7 |
| Example 8 | 15.4 |
| Example 9 | 17.6 |
| Example 10 | 18.1 |
| Comparative Example 1 | 18.6 |

INDUSTRIAL APPLICABILITY

The resist underlayer film-forming composition according to the present invention can provide a composition for forming a resist underlayer film that can form a desired resist pattern, a method for manufacturing a substrate with a resist pattern using the resist underlayer film-forming composition, and a method for manufacturing a semiconductor device.

The invention claimed is:

1. A resist underlayer film-forming composition comprising a polymer and a solvent, wherein the polymer has a repeating unit structure containing a heterocyclic ring, and at least a part of the repeating unit structure contains a basic organic group substituted with a protecting group.

2. A resist underlayer film-forming composition comprising a polymer and a solvent, wherein the polymer has a repeating unit structure containing a heterocyclic ring, and the polymer contains a basic organic group substituted with a protecting group at a terminal wherein the basic organic group substituted with a protecting group is an acyloxy group having an amino group substituted with a protecting group or an acyloxy group having a nitrogen-containing heterocyclic ring substituted with a protecting group, wherein the protecting group is selected from the group consisting of a tert-butoxycarbonyl group, a benzyloxycarbonyl group, a 9-fluorenylmethyloxycarbonyl group, a 2,2,2-trichloroethoxycarbonyl group, and an allyloxycarbonyl group, and wherein, when the protecting group is a tert-butoxycarbonyl group, the acyloxy group having an amino group substituted with a protecting group or the acyloxy group having a nitrogen-containing heterocyclic ring substituted with a protecting group is selected from the group consisting of the following formulas (a) through (h) and (j) through (n)

(a)

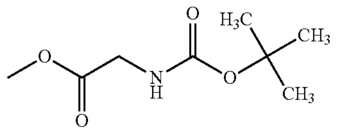

(b)

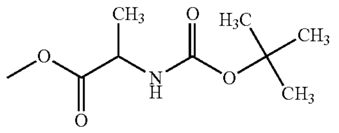

-continued (c)

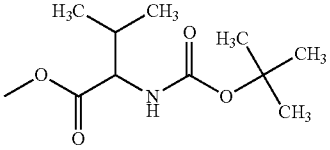

(d)

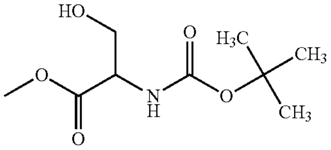

(e)

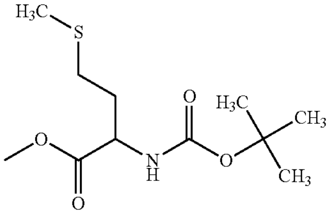

(f)

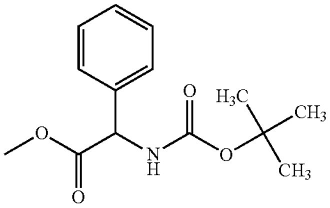

(g)

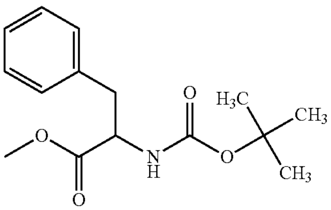

(h)

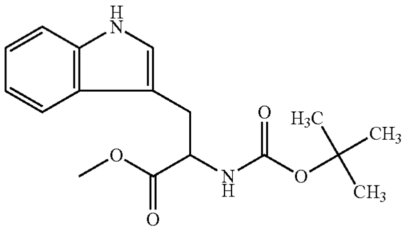

(j)

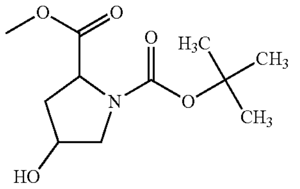

(k)

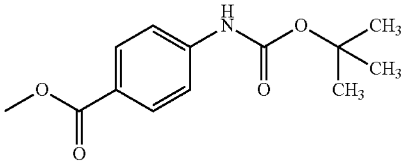

-continued (l)

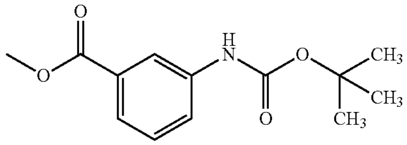

(m)

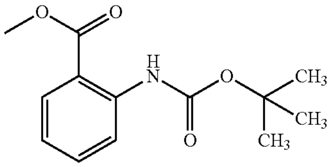

(n)

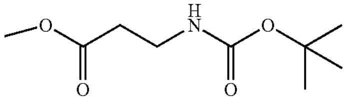

3. The resist underlayer film-forming composition according to claim 1, wherein the polymer contains a heterocyclic ring containing an alkenyl group having 2 to 10 carbon atoms.

4. The resist underlayer film-forming composition according to claim 1, wherein the polymer contains two or more of the heterocyclic rings.

5. The resist underlayer film-forming composition according to claim 1, wherein the polymer has at least one structural unit represented by the following Formula (3) in a main chain,

[Chem. 45]

(3)

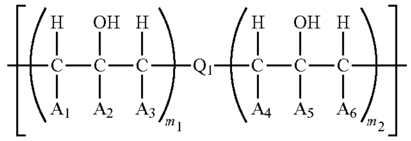

wherein in Formula (3), A1, A2, A3, A4, A5, and A6 each independently represent a hydrogen atom, a methyl group, or an ethyl group; $Q_1$ represents a divalent organic group containing a heterocyclic ring; and m1 and m2 each independently represent 0 or 1.

6. The resist underlayer film-forming composition according to claim 5, wherein in Formula (3), $Q_1$ represents a divalent organic group represented by the following Formula (5),

[Chem. 46]

(5)

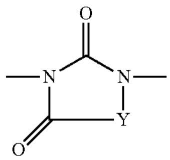

wherein in Formula (5), Y represents a divalent group represented by the following Formula (6) or (7),

[Chem. 47]

(6)

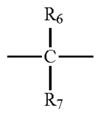

(7)

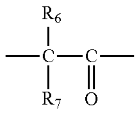

wherein in Formulas (6) and (7), $R_6$ and $R_7$ each independently represent a hydrogen atom, an alkyl group having 1 to 10 carbon atoms, an alkenyl group having 2 to 10 carbon atoms, a benzyl group, or a phenyl group, and the phenyl group may be substituted with at least one member selected from the group consisting of an alkyl group having 1 to 10 carbon atoms, a halogen atom, an alkoxy group having 1 to 10 carbon atoms, a nitro group, a cyano group, and an alkylthio group having 1 to 6 carbon atoms, or $R_6$ and $R_7$ may be bonded to each other to form a ring having 3 to 6 carbon atoms together with a carbon atom bonded to $R_6$ and $R_7$.

7. The resist underlayer film-forming composition according to claim 5, wherein in Formula (3), $Q_1$ is a divalent organic group having an aromatic ring structure having 6 to 40 carbon atoms which may contain a hydroxy group.

8. The resist underlayer film-forming composition according to claim 1, wherein the polymer further contains a disulfide bond in a main chain.

9. The resist underlayer film-forming composition according to claim 1, wherein the basic organic group substituted with a protecting group is an acyloxy group having an amino group substituted with a protecting group or an acyloxy group having a nitrogen-containing heterocyclic ring substituted with a protecting group.

10. The resist underlayer film-forming composition according to claim 9, wherein the protecting group is selected from the group consisting of a tert-butoxycarbonyl group, a benzyloxycarbonyl group, a 9-fluorenylmethyloxycarbonyl group, a 2,2,2-trichloroethoxycarbonyl group, and an allyloxycarbonyl group.

11. The resist underlayer film-forming composition according to claim 1, further comprising an acid generator.

12. The resist underlayer film-forming composition according to claim 1, further comprising a crosslinking agent.

13. A resist underlayer film, which is a baked product of a coating film formed of the resist underlayer film-forming composition according to claim 1.

14. A method for manufacturing a patterned substrate, the method comprising:

applying the resist underlayer film-forming composition according to claim 1 onto a semiconductor substrate and baking the resist underlayer film-forming composition to form a resist underlayer film;

applying a resist onto the resist underlayer film and baking the resist to form a resist film;

exposing the resist underlayer film and the semiconductor substrate coated with the resist; and developing the resist film after the exposure and performing patterning.

15. A method for manufacturing a semiconductor device, the method comprising:

forming a resist underlayer film from the resist underlayer film-forming composition according to claim 1 on a semiconductor substrate;

forming a resist film on the resist underlayer film;

forming a resist pattern by irradiating the resist film with a light or electron beam followed by development;

forming a patterned resist underlayer film by etching the resist underlayer film through the formed resist pattern; and processing the semiconductor substrate by the patterned resist underlayer film.

* * * * *